(12) United States Patent
DeVoe et al.

(10) Patent No.: US 7,026,103 B2
(45) Date of Patent: Apr. 11, 2006

(54) MULTICOLOR IMAGING USING MULTIPHOTON PHOTOCHEMICAL PROCESSES

(75) Inventors: Robert J. DeVoe, Oakdale, MN (US); Robert D. DeMaster, Afton, MN (US); Brook F. Duerr, Lake Elmo, MN (US); Jonathan P. Kitchin, Austin, TX (US); Dennis E. Vogel, Lake Elmo, MN (US)

(73) Assignee: 3M Innovative Properties Company, St. Paul, MN (US)

(*) Notice: Subject to any disclaimer, the term of this patent is extended or adjusted under 35 U.S.C. 154(b) by 165 days.

(21) Appl. No.: 10/297,972

(22) PCT Filed: Jun. 14, 2001

(86) PCT No.: PCT/US01/40981
§ 371 (c)(1),
(2), (4) Date: Dec. 12, 2002

(87) PCT Pub. No.: WO01/96952
PCT Pub. Date: Dec. 20, 2001

(65) Prior Publication Data
US 2003/0194651 A1 Oct. 16, 2003

Related U.S. Application Data

(60) Provisional application No. 60/211,669, filed on Jun. 15, 2000.

(51) Int. Cl.
*G03C 1/73* (2006.01)
*G03C 7/02* (2006.01)
*G03C 7/46* (2006.01)

(52) U.S. Cl. .......... 430/333; 430/340; 430/343
(58) Field of Classification Search .......... 430/333, 430/340, 343
See application file for complete search history.

(56) References Cited

U.S. PATENT DOCUMENTS 3,018,262 A 1/1962 Schroeder
3,117,099 A 1/1964 Proops et al.
3,635,545 A 1/1972 VanKerkhove et al.

(Continued)

FOREIGN PATENT DOCUMENTS

| DE | 41 42 327 | 6/1993 |
|----|-----------|--------|
| DE | 42 19 376 | 12/1993 |
| DE | 19653413 | 6/1998 |
| JP | 6-097791 | 5/1987 |
| WO | WO 92/00185 | 1/1992 |
| WO | WO 97/27519 | 7/1997 |
| WO | WO 98/21521 | 5/1998 |
| WO | WO 99/23650 | 5/1999 |
| WO | WO 99/53242 | 10/1999 |
| WO | WO 99/54784 | 10/1999 |
| WO | WO 02/079691 | 10/2002 |

OTHER PUBLICATIONS

R. D. Allen, G. M. Wallraff, W. D. Hinsberg, and L. L. Simpson in *High Performance Acrylic Polymers for Chemically Amplified Photoresist Applications, J. Vac. Sci. Technol.* B, 9, 3357 (1991).

C. Xu and W. W. Webb in *J. Opt. Soc. Am. B*, 13, 481 (1996).

R. D Allen et al. in *Proc. SPIE* 2438, 474 (1995).

(Continued)

*Primary Examiner*—Richard L. Schilling
(74) *Attorney, Agent, or Firm*—H. Sanders Gwin; Lucy C. Weiss

(57) ABSTRACT

A multilayer imageable article with at least two layers including a multiphoton imageable composition. The composition includes a multiphoton-sensitive photoactive system and at least one of a dye and a dye precursor. The photoactive system includes a multiphoton sensitizer capable of simultaneously absorbing at least two photons, an electron acceptor capable of transformation to a dye-activating species upon interaction with the multiphoton sensitizer subsequent to absorption of at least two photons, and optionally an electron donor.

29 Claims, 1 Drawing Sheet

U.S. PATENT DOCUMENTS

| | | |
|---|---|---|
| 3,720,921 A | 3/1973 | Schools et al. |
| 3,729,313 A | 4/1973 | Smith |
| 3,741,769 A | 6/1973 | Smith |
| 3,758,186 A | 9/1973 | Brumm |
| 3,779,778 A | 12/1973 | Smith et al. |
| 3,806,221 A | 4/1974 | Kiemle |
| 3,808,006 A | 4/1974 | Smith |
| 3,954,475 A | 5/1976 | Bonham et al. |
| 3,987,037 A | 10/1976 | Bonham et al. |
| 4,041,476 A | 8/1977 | Swainson |
| 4,078,229 A | 3/1978 | Swanson et al. |
| 4,228,861 A | 10/1980 | Hart |
| 4,238,840 A | 12/1980 | Swainson |
| 4,250,053 A | 2/1981 | Smith |
| 4,279,717 A | 7/1981 | Eckberg et al. |
| 4,288,861 A | 9/1981 | Swainson et al. |
| 4,333,165 A | 6/1982 | Swainson et al. |
| 4,394,403 A | 7/1983 | Smith |
| 4,394,433 A | 7/1983 | Gatzke |
| 4,458,345 A | 7/1984 | Bjorklund et al. |
| 4,466,080 A | 8/1984 | Swainson et al. |
| 4,471,470 A | 9/1984 | Swainson et al. |
| 4,491,628 A | 1/1985 | Ito et al. |
| 4,496,216 A | 1/1985 | Cowan |
| 4,547,037 A | 10/1985 | Case |
| 4,588,664 A | 5/1986 | Fielding et al. |
| 4,642,126 A | 2/1987 | Zador et al. |
| 4,652,274 A | 3/1987 | Boettcher et al. |
| 4,666,236 A | 5/1987 | Mikami et al. |
| 4,775,754 A | 10/1988 | Vogel et al. |
| 4,859,572 A | 8/1989 | Farid et al. |
| 4,877,717 A | 10/1989 | Suzuki et al. |
| 4,963,471 A | 10/1990 | Trout et al. |
| 5,006,746 A | 4/1991 | Kasuga et al. |
| 5,034,613 A | 7/1991 | Denk et al. |
| 5,037,917 A | 8/1991 | Babb et al. |
| 5,145,942 A | 9/1992 | Hergenrother et al. |
| 5,159,037 A | 10/1992 | Clement et al. |
| 5,159,038 A | 10/1992 | Babb et al. |
| 5,225,918 A | 7/1993 | Taniguchi et al. |
| 5,235,015 A | 8/1993 | Ali et al. |
| 5,283,777 A | 2/1994 | Tanno et al. |
| 5,289,407 A | 2/1994 | Strickler et al. |
| 5,405,733 A | 4/1995 | Sirkin et al. |
| 5,422,753 A | 6/1995 | Harris |
| 5,446,172 A | 8/1995 | Crivello et al. |
| 5,478,869 A | 12/1995 | Takahashi et al. |
| 5,479,273 A | 12/1995 | Ramsbottom |
| 5,529,813 A | 6/1996 | Kobsa et al. |
| 5,545,676 A | 8/1996 | Palazzotto et al. |
| 5,665,522 A | 9/1997 | Vogel et al. |
| 5,703,140 A | 12/1997 | Kunita et al. |
| 5,747,550 A | 5/1998 | Nohr et al. |
| 5,750,641 A | 5/1998 | Ezzell et al. |
| 5,753,346 A | 5/1998 | Leir et al. |
| 5,759,721 A | 6/1998 | Dhal et al. |
| 5,759,744 A | 6/1998 | Brueck et al. |
| 5,770,737 A | 6/1998 | Reinhardt et al. |
| 5,847,812 A | 12/1998 | Ooki et al. |
| 5,854,868 A | 12/1998 | Yoshimura et al. |
| 5,856,373 A | 1/1999 | Kaisaki et al. |
| 5,859,251 A | 1/1999 | Reinhardt et al. |
| 5,864,412 A | 1/1999 | Wilde |
| 5,952,152 A | 9/1999 | Cunningham et al. |
| 5,998,495 A | 12/1999 | Oxman et al. |
| 6,005,137 A | 12/1999 | Moore et al. |
| 6,025,406 A | 2/2000 | Oxman et al. |
| 6,025,938 A | 2/2000 | Kathman et al. |
| 6,030,266 A | 2/2000 | Ida et al. |
| 6,043,913 A | 3/2000 | Lu et al. |
| 6,048,911 A | 4/2000 | Shustack et al. |
| 6,051,366 A | 4/2000 | Baumann et al. |
| 6,100,405 A | 8/2000 | Reinhardt et al. |
| 6,103,454 A | 8/2000 | Dhar et al. |
| 6,107,011 A | 8/2000 | Gelbart |
| 6,215,095 B1 | 4/2001 | Partanen et al. |
| 6,262,423 B1 | 7/2001 | Hell et al. |
| 6,267,913 B1 | 7/2001 | Marder et al. |
| 6,297,910 B1 | 10/2001 | Xuan et al. |
| 6,312,876 B1 | 11/2001 | Huang et al. |
| 6,316,153 B1 | 11/2001 | Goodman et al. |
| 6,322,931 B1 | 11/2001 | Cumpston et al. |
| 6,322,933 B1 | 11/2001 | Daiber et al. |
| 6,441,356 B1 | 8/2002 | Mandella et al. |
| 6,541,591 B1 | 4/2003 | Olson et al. |
| 6,608,228 B1 * | 8/2003 | Cumpston et al. |
| 6,624,915 B1 | 9/2003 | Kirkpatrick et al. |
| 6,703,188 B1 | 3/2004 | Kagami et al. |
| 6,750,266 B1 * | 6/2004 | Bentsen et al. |
| 2002/0034693 A1 | 3/2002 | Fukuda et al. |
| 2004/0067431 A1 * | 4/2004 | Atney et al. |
| 2005/0009175 A1 | 1/2005 | Bergh et al. |
| 2005/0054744 A1 * | 3/2005 | DeVoe .................. 522/1 |

OTHER PUBLICATIONS

I. B. Berlman in *Handbook of Fluorescence Spectra of Aromatic Molecules*, Second Edition, pp. 24–27, Academic Press, New York (1971).

J. N. Demas and G. A. Crosby in *J. Phys. Chem.* 75, 991–1024 (1971).

Lipson et al., *Nature of the Potential Energy Surfaces for the Sn1 Reaction A Picosecond Kinetic Study of Homolysis and Heterolysis for Diphenylmethyl Chlorides*, J. Am. Chem. Soc., vol. 118, pp. 2992–2997, 1996.

Lorenz et al., *SU–8: a low cost negative resist for MEMS*, J. Micromech. Microeng., vol. 7, pp. 121–124, 1997.

Maiti et al., *Measuring Serotonin Distribution in Live Cells with Three–Photon Excitation*, Science, vol. 275, pp. 530–532, Jan. 1997.

Mar., *Advanced Organic Chemistry: Reactions, Mechanisms and Structure*, Four Edition, 1992, Wiley–Interscience, New York, p. 205.

Mar., *Advanced Organic Chemistry: Reactions, Mechanisms and Structure*, Four Edition, 1992, Wiley–Interscience, New York, Chapter 2.

Mar., *Advanced Organic Chemistry: Reactions, Mechanisms and Structure*, Four Edition, 1992, Wiley–Interscience, New York, Chapter 9.

Maruo et al., *Two–Photon–Absorbed Photopolymerization for Three–Dimensional Microfabrication*, IEEE, The Tenth Annual International Workshop on Micro Electro Mechanical Systems, pp. 169–174, 1997.

Maruo et al., *Three–Dimensional Microfabrication With Two–Photon–Absorbed Photopolymerization*, Optics Letters, vol. 22, No. 2, pp. 132–134, Jan. 1997.

McClelland et al., *Laser Flash Photolysis of 9–Fluorenol. Production and Reactivities of the 9–Fluorenol Radical Cation and the 9–Fluorenyl Cation*, J. Am. Chem. Soc., vol. 112, pp. 4857–4861, 1990.

McClelland et al., *Flash Photolysis Study of a Friedel–Crafts alkylation. Reaction of the Photogenerated 9–Fluorenyl cation with aromatic compounds*, J. Chem. Soc., vol. 2, pp. 1531–1543, 1996.

Odian, *Principles of Polymerization Second Edition John Wiley & Sons*, New York, 1981, pp. 181.

Richardson, *Langmuir–Blodgett Films, An Introduction to Molecular Electronics*, Chapter 10, 1995.

Pitts et al., *Submicro Multiphoton Free–Form Fabrication of Proteins and Polymers : Studies of Reaction Efficiencies and Applications in Sustained Release*, Macromolecules, vol. 33, pp. 1514–1523, 2000.

He et al., *Two–Photon Absorption and Optical–Limiting Properties of Novel Organic Compounds*, Optics Letters, vol. 20, No. 5, pp. 435–437, Mar. 1995.

Parthenopoulos et al., *Three–Dimensional Optical Storage Memory*, Science, vol. 245, pp. 843–845, Aug. 1989.

Shaw et al., Negative Photoresists for Optical Lithography, IBM J. Res. Develop., vol. 41, No. ½, pp. 81–94, Jan./Mar. 1997.

Shirai et al., *Photoacid and Photobase Generators : Chemistry and Applications to Polymeric Materials*, Prog. Polym. Sci., vol. 21, pp. 1–45, 1996.

Smith, *Modern Optic Engineering*, 1966, McGraw–Hill, pp. 104–105.

Strickler et al., *Three–Dimensional Optical Data Storage in Refractive Media by Two–Photon Point Excitation*, Optics Letters, vol. 16, No. 22, pp1780–1782, Nov. 1991.

Strickler et al.,*3–D Optical Data Storage By Two–Photon Excitation*, Adv. Mater., vol. 5, No. 6, pp. 479, 1993.

Thayumanavan et al., Synthesis of Unsymmetrical Triarylamines for Photonic Applications via One–Pot Palladium–Catalyzed Aminations, Chem. Mater., vol. 9, pp. 3231–3235, 1997.

Wenseleers et al., *Five Orders–of–Magnitude Enhancement of Two–Photon Absorption for Dyes On Silver Nanoparticle Fractal Clusters*, J. Phys. Chem. B, vol. 106, pp. 6853–6863, 2002.

Zhou et al.. *Efficient Photacids Based Upon Triarylamine Dialkylsulfonium Salts*, J. Am. Chem. Soc., vol. 124, No. 9, pp. 1897–1901.

Zhou et al., *An Efficient Two–Photon–Generated Photoacid Applied To Positive–Tone 3D Microfabrication*, Science, vol. 296, pp. 1106–1109, May 10, 2002.

Stellacci et al., *Laser and Electron–Beam Induced Growth of Nanoparticles for 2D and 3D Metal Patterning, Adv. Mater.*, vol. 14, No. 3, pp. 194–198, Feb. 2002.

Watanabe et al., *Photoreponsive Hydrogel Microstructure Fabricated by Two–Photon Initiated Polymerization*, Adv. Func. Mater., vol. 12, No. 9, pp. 611–614, Sep. 2002.

Hong–Bo Sun, *Real Three–Dimensional Microstructures Fabricated By Photpolymerization of Resins Through Two–Photon Absorption*, Optical Letters, vol. 25, No. 5, pp. 1110–1112, Aug. 2000.

Misawa et al., *Microfabrication By Femtosecond Laser Irradiation*, SPIE,, vol. 3933, pp. 246–260, 2000.

Miwa, *Femtosecond Two–Photon Stereo–Lithography*, Applied Physics A, vol. 73, No. 5, pp. 561–566, 2001.

Kawata et al., *Two–Photon Photopolymerization of Functional Micro–Devices*, Journal of Photopolymer Science and Technology, vol. 15, No. 3, pp. 471–474, 2002.

Boiko et al., *Thresold Enhancement in Two–Photon Photopolymerization*, SPIE, vol. 4097, pp. 254–263, 2000.

Belfield et al., *Multiphoton–Absorbing Organic Materials For Microfabrication*, emerging Optical Applications and Non–Destructive Three–Dimensional Imaging, J. Phys. Org.,vol. 13, pp. 837–849, 2000.

Serbin et al., *Femtosecond Laser–Induced Two–Photon Polymerization of Inorganic–Organic Hybrid Materials for Applications in Photonics*, Optics Letters, vol. 28, No. 5, pp. 301–303, Mar. 2003.

Davidson, *The Chemistry of Photoinitiators Some Recent Developments*, J. Photochem. Photobiol. A., vol. 73, pp. 81–96, 1993.

Dektar et al., *Photochemistry of Triarylsulfonium Salts*, J. Am. Chem. Soc., vol. 112, pp. 6004–6015, 1990.

Denk et al., *Two–Photon Laser Scanning Fluorescence Microscopy*, Science, vol. 248, pp. 73–76, Apr. 1990.

Dvornikov et al., *Two–Photon Three–Dimensional Optical Storage Memory*, Advances in Chemistry Series, vol. 240, pp. 161–177, 1994.

Goppert–Mayer, *Uber Elmentarakte Mit zwei Quantesprungen*, Ann. Phys., vol. 9, pp. 273–294, 1931.

Ito, *Chemical Amplification Resists: History and Development Within IBM*, IBM J. Res. Develop., vol. 41, No. ½, pp. 69–80, Mar. 1997.

Jenkins et al., *Fundamentals of Optics*, 3rd Edition, McGraw–Hill, New York, pp. 331, 1957.

Kavarnos et al., *Photosensitization By Reversible Electron Transfer : Theories, Experimental Evidence, and Examples*, Chem. Rev., vol. 86, pp. 401–449, Apr. 1986.

Kennedy et al., *p–Bis(o–methylstyryl) benzene as a Power–Squared Sensor for Two–Photon Absorption Measurements between 537 and 694 nm*, Anal. Chem., vol. 58, pp. 2643–2647, 1986.

Kewitsch et al., *Self–Focusing and Self–Trapping of Optical Beams Upon Photopolymerization*, Optics Letters, vol. 21, No. 1, pp. 24–26, Jan. 1996.

Lee et al., Micromachining Applications of a High Resolution Ultrathick Photoresist, J. Vac. Sci. Technol. B, vol. 13, pp. 3012–3016, Dec. 1995.

J. V. Morris, M. A. Mahoney, and J. R. Huber in *J. Phys. Chem. 80*, 969–974 (1976).

*Bull. Chem. Soc.* Japan, 42, 2924–2930 (1969).

R. J. Cox, *Photographic Sensitivity*, Academic Press (1973), R.J. Cox, ed., pp. 241–263.

D. F. Eaton in *Advances in Photochemistry*, B. Voman et al., vol. 13, pp. 427–488, (1986).

Beringer et al., *J. Am. Chem. Soc. 81*, 342 (1959).

Makukha et al., *Two–Photon–Excitation Spatial Distribution for Cross Focused Gaussian Beams*, Applied Optics, vol. 40, No. 23, pp. 3932–3936 (Aug. 10, 2001).

Bunning et al. *Electronically Switchable Grating Formed Using Ultrafast Holographic Two–Photon–Induced Photopolyrnerization*, Chem. Mater., 2000, 12 pp. 2842–2844.

Diamond et al., *Two–Photon Holography in 3–D Photopolymer Host–Guest Matrix*, Optics Express, vol. 6, No. 3, Jan. 31, 2000, pp. 64–68.

Diamond et al., *Two–Photon Holography in 3–D Photopolymer Host–Guest Matrix: errata ,Optic Express*, vol. 6, No. 4, Feb. 14, 2000, pp. 109–110.

Ashley et al., *Holographic Data Storage*, IBM J. Res. Develop. vol. 44, No. 3, May 2000, pp. 341–368.

Belfield et al., *Near–IR Two–Photon Photoinitiated Polymerization Using a Fluorone/Amine Initiating System*, J. Am. Chem. Soc., 2000, 122 pp. 1217–1218.

Campagnola et al., *3–Dimensional Submicron Polymerization of Acrylamide By Multiphoton Excitation of Xanthene Dyes*, Macromolecules, 2000, vol. 33, pp. 1511–1513.

Hong–Bo Sun et al., *Three–dimensional Photonic Crystal Structures Achieved With Two–Photon–Absorption Photopolymerization of Material*, Applied Physics Letters, vol. 74, No. 6, Feb. 8,1999, pp. 786–788.

Cumpston et. al. *Two–Photon Polymerization Initiators For Three–Dimensional Optical Data Storage and Microfabrication*, Nature, vol. 398, Mar. 4, 1999, pp. 51–54.

Joshi et al., *Three–dimensional Optical Circuitry Using Two–Photo–Assisted Polymerization*, Applied Physics Letters, vol. 74, No. 2, Jan. 11, 1999, pp. 170–172.

Bunning et al., *Electrically Switchable Grating Formed Using Ultrafast Holographic Two–Photon–Induced Photopolymerization*, Chem. Mater. 2000, vol. 12, pp. 2842–2844.

Kirkpatrick et al. *Holographic Recording Using Two–Photon–Induced Photopolymerization*, Appl. Phys. A, vol. 69, pp. 461–464, 1999.

Maruo s et al., *Movable Microstructures made by Two–Photon Three–Dimensional Microfabrication*, 1999 International Symposium on Micromechatronics and Human Science, vol. 23, pp. 173–178 XP002191032.

Kuebler S M et al., *Three–Dimensional Microfabrication Using Two–Photon Activated Chemistry*, SPIE vol. 3937, pp. 97–105, Jan. 27, 2000 XP008000209.

Cumpston B H et al., *New Photopolmers Based on Two–Photon Absorbing Chromophores and Application to Three–Dimensional Microfabrication and Optical Storage*, Mat. Res. Soc. Symp. Proc., vol. 488, pp. 217–225, 1998, XP008000191.

Kawata S. et al., *Photon–Iduces Micro/Nano Fabrication, Manipulation and Imaging with Unconvential Photo–Active Systems*, Mol. Cryst. Liq. Cryst., vol. 314, pp. 173–178, Aug. 25, 1997, XP001059839.

Tanaka et al., *Three–Dimensional Fabrication and Observation of Micro–Structures Using Two–Photon Absorption and Fluorescence*, SPIE, vol. 3937, pp. 92–96, Jan. 27, 2000, XP001051866.

Wan et al., *Contrasting Photosolvolytic Reactivities of 9–Fluorenol vs. 5–Suberenol Derivatives. Enhanced Rate of Formation of Cyclically Conjugated Four π Carbocations in the Excited State*, J. Am. Chem. Soc., vol. 111, pp. 4887–4895, 1989.

Williams et al., *Two–Photon Molecular Excitation Provides Intrinsic 3–Dimensional Resolution for Laser–based Microscopy and Microphotochemistry*, FASEB Journal, vol. 8, pp. 804–813, Aug. 1994.

Xu et at., *Multiphoton Fluorescence Excitation: New Spectral Windows for Biological Nonlinear Microscopy*, Proc. Natl. Acad. Sci. USA, vol. 93, pp. 10763–10768, Oct. 1996.

Yuste et at., *Dendritic Spines as Basic Functional Units of Neuronal Integration*, Nature, vol. 375, pp. 682–684, Jun. 1995.

Kosar, *Photochemical Formation and Destruction of Dyes, Light–Sensitive Systems*, John Wiley & Sons, New York, NY, 1965, Chapter 8.

Badlwinson, *Auxiliaries Associated With Main Dye Classes, Colorants and Auxiliaries*, vol. 2, 1990, Chapter 12.

Syper et al., *Synthesis of Oxiranylquinones as New Potential Bioreductive Alkylating Agents*, Tetrahedron, vol. 39, No. 5, pp. 781–792, 1983.

Zollinger, *Color Chemistry*, VCH, Weinheim, GE, 1991, Chapter 8.

Misawa et al., *Multibeam Laser Manipulation and Fixation of Microparticles*, Appl. Phys. Letter, vol. 60, No. 3, pp. 310–312, Jan. 20, 1992. (XP 002189602).

Sun et al., *Photonic Crystal Structures With Submicrometer Spatial Resolution Achieved By High Power Femtosecond Laser–Induced Photopolymerization*, SPIE, vol. 3888, pp. 122–130, 2000. (XP 001051864).

Belfield et al., Near–IR two photon absorbing dyes and photoinitiated cationic polymerization, Polymer Preprints, vol. 41(1) pp. 578–579 (Mar. 2000).

Belfield et al., Multiphoton–absorbing organic material for microfabrication, emerging optical applications and non–destructive three dimensional imaging, J.Phys. Org. Chem. vol. 13, pp. 837–849 (2000).

\* cited by examiner

MULTICOLOR IMAGING USING MULTIPHOTON PHOTOCHEMICAL PROCESSES

RELATED APPLICATIONS

This application claims priority from U.S. Provisional Application No. 60/211,669, filed Jun. 15, 2000, which is hereby incorporated by reference.

TECHNICAL FIELD

This Invention relates to the use of multiphoton imageable compositions to produce multicolor images using additive or subtractive processes.

BACKGROUND

Multicolor hardcopy images for viewing by reflection in ambient white light are produced primarily by a subtractive color process, which produces a composite image with three overlaid images of the subtractive primary colors (yellow, magenta and cyan). Subtractive color image forming processes may include printing processes and photographic processes.

Photographic processes generate yellow, magenta and cyan component images using a specially prepared, radiation-sensitive substrate, which contains precursors to the colorants. Most commonly, the three colorant precursors are coated in three different layers of a multilayer construction. Each colorant precursor is sensitized to a discrete range of wavelengths, such that the yellow, magenta and cyan images can be formed independently by exposure to different wavelength ranges for each of the three colors.

Many image-forming chemistries are known that can be used to form a permanent color image by means of image-wise exposure to radiation. For example, silver halide crystals (known as silver halide emulsions) may be sensitized to wavelengths from about 350 nm to about 1300 nm. Variations in the chemistry and processing conditions of the silver halide material may lead to either negative acting processes, by which a dye image is formed in those areas that have been exposed to radiation, or to positive acting processes, by which a dye image is formed in those areas that have not been exposed to radiation. In addition, many non-silver, full-color imaging materials have been described, based upon photogeneration or photobleaching of yellow, magenta and cyan colorants in an integral construction. In all of these cases, a full color image is generated in an integral construction using radiation of at least three different wavelengths to form the yellow, magenta and cyan images.

Analog photographic processes customarily use visible radiation of complementary color to render the image in a particular color-forming layer. Digital photography separates the image capture process from the final image generation process. Any wavelength, including non-visible infrared or UV wavelengths may, in principle, be used to generate any one of the yellow, magenta or cyan images to reproduce a full color image from digitally stored information.

Printing processes imagewise transfer yellow, magenta and cyan colorants to a substrate, typically a white substrate such as paper. Printing processes include, for example, lithographic, gravure, letterpress, and flexographic printing, as well as electrophotographic, inkjet, and other methods. It is common practice, in some of these printing processes, to add a fourth image component containing a black colorant.

Printing processes generally require that color proofs be generated at various stages in the printing process. In a typical color print process, one or more of the following proofing steps would be performed depending on the type of print job, printing budget, time requirements, and available equipment.

First, a layout proof is printed from a layout/creation computer software program, usually to an inexpensive inkjet or a monochrome laser. Second, a color layout proof is created with more accurate colors, usually utilizing a printer with some level of color calibration. An analog contract proof is then produced by utilizing a film, which also makes the printing plates, and often the print stock to be used in the final printing. The resulting proofs are used by the press operators in the final printing.

One widely used form of creating full-color analog proofs is commercially available under the trade designation MATCHPRINT (Imation Corp., Oakdale, Minn.). This system requires preparation of separate color films, which are exposed separately and then laminated together. Careful alignment of the separate color films, prior to lamination, is required to produce accurate color proofs. A properly prepared proof has a color range that is roughly equivalent to or exceeds what can be replicated on a press. A digital contract proof may also be generated from a printout of a computer file by printing using the same types of printers used in the earlier color layout proof. However, a digital contract proof must accurately mimic the color/output characteristics of the press, rather than calibrating output to match the designer's monitor or submitted color samples.

Digital proofing is gaining acceptance as digital presses and CTP schemes, neither of which require creation of film, become more prevalent. Although a digital contract proof can be generated from a file printout using a mid-level color laser or inexpensive inkjet printer, high quality digital proofing generally utilizes print methods, such as dye sublimation (dye-sub), thermal wax, and high-end inkjet printers.

Dye-sub printers are capable of producing continuous tone photographs and can easily surpass the color capabilities of the press. However, dye-sub printers have relatively high consumable costs and need to use special coated stock (usually a glossy, bright paper), malting it impossible to duplicate the actual press stock.

Finally, a press check is performed to generate a proof that is actually produced on the press. Since only relatively minor color adjustments can be made on the press, content editing and major color changes almost always require new printing plates to be created. Each proofing stage may include multiple cycles of proofing, reviewing, revising, and re-proofing.

SUMMARY

In conventional imaging and printing processes, the layered structures absorb wavelengths of light linearly proportional to the intensity of radiation incident on the layered structure. In these structures, radiation intended to expose the lower layers is grossly attenuated by absorption in the upper layers, and, as a result, the structures have poor spatial resolution. In conventional imaging processes, multiple layers, each sensitive to a specific wavelength of radiation, are required to form a multicolor image. In conventional printing processes, multiple layers, each a different color, are required to form a multicolor proof or print a multicolor image on a substrate. These image forming steps require complex chemistry and complex lamination steps that are time consuming, expensive and inaccurate.

The invention provides a method for printing or forming an image that includes a construction having multiple layers, each sensitive to the same wavelength of radiation, which can be used to form a multicolor image. The required spatial resolution results from application of two-photon photochemical processes described in WO 99/53242, 98/21521 and 99/54784 to the imaging and printing process. There are two key differences between two-photon induced photoprocesses and single-photon induced processes. Whereas single-photon absorption scales linearly with the intensity of the incident radiation, two-photon absorption scales quadratically. Higher-order absorptions scale with a related higher power of incident intensity. As a result, it is possible to perform multiphoton processes with three-dimensional spatial resolution. Also, because multiphoton processes involve the simultaneous absorption of two or more photons, the absorbing chromophore is excited with a number of photons whose total energy equals the energy of an excited state of the multiphoton sensitizer, even though each photon individually has insufficient energy to excite the chromophore. Because the exciting light is not attenuated by single-photon absorption within a matrix or material, it is possible to selectively excite molecules at a greater depth within a material than would be possible via single-photon excitation by use of a beam that is focused to that depth in the material. The nonlinear scaling of absorption with intensity can lead to the ability to write features having a size that is less than the diffraction limit of the light, as well as the ability to write features in three dimensions. Therefore, two-photon photochemistry both enables adequately high resolution in the vertical direction and eliminates attenuation of the imaging radiation except at the point of intended exposure.

In one embodiment, the invention is a multilayer imageable article, wherein the article includes at least two layers including a multiphoton imageable composition, wherein the composition includes at least one of a dye and a dye precursor; and a multiphoton-sensitive photoactive system, wherein the photoactive system includes: a multiphoton sensitizer capable of simultaneously absorbing at least two photons; an electron acceptor capable of transformation to a dye-activating species upon interaction with the multiphoton sensitizer subsequent to absorption of at least two photons; and optionally, an electron donor.

In a second embodiment, the invention is a method for making a multicolor image, including: providing a multilayer imageable article, wherein at least two layers of the article include: at least one of a dye and a dye precursor; and a multiphoton sensitive photoactive system, wherein the photoactive system includes a multiphoton sensitizer capable of simultaneously absorbing at least two photons; an electron acceptor capable of transformation to a dye-activating species upon interaction with the multiphoton sensitizer subsequent to absorption of at least two photons; and optionally, an electron donor; and imaging at least one layer to activate the photoactive system and form a multicolor image.

In a third embodiment, the invention is a multiphoton imageable composition, wherein the composition includes at least one multiphoton sensitizer capable of simultaneously absorbing at least two photons; an electron acceptor capable of transformation to a dye-activating species upon interaction with the multiphoton sensitizer subsequent to absorption of at least two photons; at least one of a dye and a dye-precursor; and, optionally, an electron donor.

In a fourth embodiment, the invention is a multiphoton imaging system, including: an exposure system including at least one light source and at least one optical element, a multilayer imageable article with at least two layers including a multiphoton imageable composition, wherein the imageable composition includes at least one of a dye and a dye precursor; and a multiphoton-sensitive photoactive system, the photoactive system including a multiphoton sensitizer capable of simultaneously absorbing at least two photons; an electron acceptor capable of transformation to a dye-activating species upon interaction with the multiphoton sensitizer subsequent to absorption of at least two photons; and optionally, an electron donor.

In a fifth embodiment, the invention is a method for making a multicolor proof, including: providing a multilayer imageable article, wherein the article includes at least two layers including a multiphoton imageable composition, wherein the imageable composition includes at least one of a dye and a dye precursor and a multiphoton-sensitive photoactive system, the photoactive system including a multiphoton sensitizer capable of simultaneously absorbing at least two photons; an electron acceptor capable of transformation to a dye-activating species upon interaction with the multiphoton sensitizer subsequent to absorption of at least two photons; and optionally, an electron donor.

Full color imaging with a multiphoton process uses a single wavelength of monochromatic radiation, and simplifies the chemistry of the imaging construction. The imaging sheet may be handled in normal room light, since ambient lighting is not of sufficient intensity to expose the imaged sheet at the wavelength of two photon absorption. Since multiple layers may be exposed by a single wavelength, color proofs may be prepared without the lamination steps required with conventional imaging chemistries.

DESCRIPTION OF DRAWINGS

Like reference symbols in the various drawings indicate like elements.

DETAILED DESCRIPTION

Figure 1:
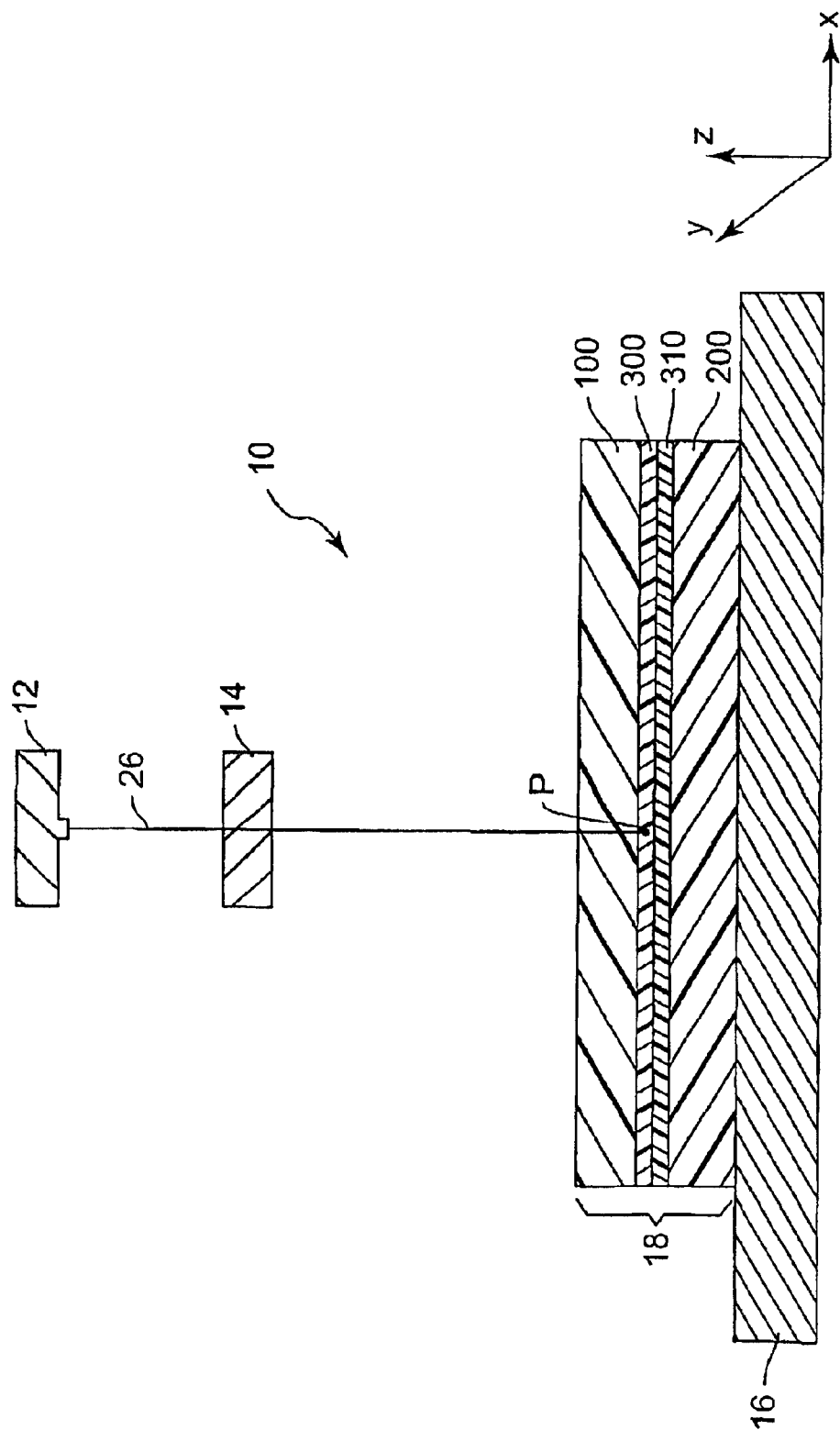
FIG. 1 is a schematic representation of an imaging system with the multiphoton imageable composition of the invention.

The details of one or more embodiments of the invention are set forth in the accompanying drawings and the description below. Other features, objects, and advantages of the invention will be apparent from the description and drawings, and from the claims.

Definitions used in the present description:

"multiphoton" means simultaneous absorption of two or more photons to reach an excited state;

"simultaneous" means two events that occur within the period of $10^{-14}$ seconds or less;

"excited state" means an electronic state of a molecule wherein electrons populate an energy state that is higher than another energy state for the molecule;

"optical system" means a system for controlling light, the system including at least one element chosen from refractive optical elements such as lenses, reflective optical elements such as mirrors, and diffractive optical elements such as gratings. Optical elements shall also include diffusers, wave guides, and other elements known in the optical arts;

"three-dimensional light pattern" means an optical image wherein the light energy distribution resides in a volume or in multiple planes and not in a single plane;

"exposure system" means an optical system plus a light source;

"sufficient light" means both 1) light of sufficient intensity (units of W/cm$^2$) for multiphoton absorption and 2) light producing enough excited states in a target molecule to effect polymerization thereof, and "photosensitizer" means a molecule that lowers the energy required to activate an electron acceptor by absorbing light of lower energy than is required by the electron acceptor for activation and interacting with the electron acceptor to produce a photoinitiating species therefrom.

"optical element" means a three-dimensional structure that interacts with light by refraction, diffraction, guiding, absorption, polarization modification, combining, amplifying, or other optical effects, and can be either passive or active. Examples of optical elements include lenses, waveguides, gratings, amplifiers, electro-optic modulators, and the like; and "dye-activating species" means a compound that indirectly, i.e., through other intermediate species, or directly creates a dye or bleaches a dye.

In one embodiment, the invention is a multilayer construction with independently imageable color-forming layers. At least two layers of the construction include a multiphoton imageable composition that includes a dye or a dye precursor and a multiphoton-sensitive photoactive system. The photoactive system includes a multiphoton sensitizer capable of simultaneously absorbing at least two photons, and an electron acceptor capable of transformation to a dye-activating species upon interaction with the multiphoton sensitizer subsequent to absorption of at least two photons, and, optionally, an electron donor.

Two-photon processes are well known that can produce the following reactive species: Bronsted or Lewis acids, free radicals or excited state species which may in turn activate photo-reducing species or photo-oxidizing species. Consequently, a wide variety of color forming and color destruction chemistries may be used in the imageable composition of the present invention.

Referring to FIG. 1, an optical system 10 for use in the invention includes a light source 12, an optical element 14, and a moveable stage 16. The stage 16 is preferably moveable in three dimensions. A multiple layer construction 18 having at least two dye containing layers 300 and 310 sandwiched between an inert top layer 100 and an inert bottom layer 200 is mounted on the stage 16. A light 26 from the light source 12 is then focused to a point P within the volume of the layer 300 to control the three-dimensional spatial distribution of light intensity within the composition and form an image at point P.

Generally, light from a pulsed laser can be passed through a focusing optical train to focus the beam within the volume of the construction 18. Using the stage 16, or by moving the light source 12 (for example, moving a laser beam using galvo-mirrors), the focal point P can be scanned or translated in a three-dimensional pattern that corresponds to a desired pattern. The imaged portion then creates an image in a desired pattern.

The light source 12 in the system 10 may be any light source that produces multiphoton curing radiation—radiation capable of initiating a multiphoton curing process. Suitable sources include, for example, femtosecond near-infrared titanium sapphire oscillators (for example, those available from Coherent under the trade designation MIRA OPTIMA 900-F) pumped by an argon ion laser (for example, those available from Coherent under the trade designation INNOVA). This laser, operating at 76 MHz, has a pulse width of less than 200 femtoseconds, is tunable between 700 and 980 nm, and has average power up to 1.4 Watts. However, in practice, any light source that provides sufficient intensity (to effect multiphoton absorption) at a wavelength appropriate for the photosensitizer (used in the photoreactive system) can be utilized. Such wavelengths can generally be in the range of about 300 to about 1500 nm; preferably, from about 600 to about 1100 nm; more preferably, from about 750 to about 850 nm. Peak intensities can generally be from about $10^6$ W/cm$^2$. The upper limit on pulse fluence is generally dictated by the ablation threshold of the photoreactive composition. For example, Q-switched Nd:YAG lasers (for example, those available from Spectra-Physics under the trade designation QUANTA-RAY PRO), visible wavelength dye lasers (for example, those available from Spectra-Physics under the trade designation SIRAH pumped by a Spectra-Physics Quanta-Ray PRO), and Q-switched diode pumped lasers (for example, those available from Spectra-Physics under the trade designation FCBAR) can also be utilized. Preferred light sources are near infrared pulsed lasers having a pulse length less than about $10^{-8}$ second (more preferably, less than about $10^{-9}$ second; most preferably, less than about $10^{-11}$ second). Other pulse lengths can be used as long as the peak intensity and ablation threshold criteria above are met.

Optical elements 14 useful in the system 10 include, for example, refractive optical elements (for example, lenses), reflective optical elements (for example, retroreflectors or focusing mirrors), diffractive optical elements (for example, gratings, phase masks, and holograms), polarizing optical elements (for example, linear polarizers and waveplates), diffusers, pockels cells, wave guides, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture (NA) to provide highly-focused light. However, any combination of optical elements that provides a desired intensity profile (and spatial placement thereof) can be utilized. For example, the exposure system can include a scanning confocal microscope (for example, those available from BioRad under the trade designation MRC600) equipped with a 0.75 NA objective (such as, for example, those available from Zeiss under the trade designation 20X FLUAR).

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the multiphoton curable composition exposed. Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

The multiphoton imageable composition includes a multiphoton-sensitive photoactive system, which in turn includes at least one multiphoton photosensitizer, at least one electron acceptor capable of transformation to a dye-activating species upon interaction with the multiphoton photosensitizer subsequent to absorption of at least two photons. The composition can also include a polymeric binder. The imageable composition may also optionally include at least one electron donor compound.

Multiphoton photosensitizers suitable for use in the multiphoton-sensitive photoactive system are those that are capable of simultaneously absorbing at least two photons when exposed to sufficient light. Preferred multiphoton photosensitizers are those having a two-photon absorption cross-section greater than that of fluorescein (that is, greater than that of 3', 6'-dihydroxyspiro[isobenzofuran-1(3H), 9'-[9H]xanthen]3-one). Generally, the cross-section can be greater than about $50 \times 10^{-50}$ cm$^4$ sec/photon, as measured by the method described by C. Xu and W. W. Webb in J. Opt. Soc. Am. B, 13, 481 (1996) and WO 98/21521.

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well-known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules,* Second Edition, pages 24–27, Academic Press, New York (1971); by J. N. Demas and G. A. Crosby in J. Phys. Chem. 75, 991–1024 (1971); and by J. V. Morris, M. A. Mahoney, and J. R. Huber in J. Phys. Chem. 80, 969–974 (1976).

Assuming that the emitting slate is the same under one- and two-photon excitation (a common assumption), the two-photon absorption cross-section of the photosensizizer. ($\delta_{sam}$), is equal to $\delta_{ref} K (I_{sam}/I_{ref})(\Phi_{sam}/\Phi_{ref})$, wherein $\delta_{ref}$ is the two-photon absorption cross-section of the reference compound, $I_{sam}$ is the fluorescence intensity of the photosensitizer, $I_{ref}$ is the fluorescence intensity of the reference compound, $\Phi_{sam}$ is the fluorescence quantum efficiency of the photosensitizer, $\Phi_{ref}$ is the fluorescence quantum efficiency of the reference compound, and K is a correction factor to account for slight differences in the optical path and response of the two detectors. K can be determined by measuring the response with the same photosensitizer in both the sample and reference arms. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregation effects).

When the photosensitizer is not fluorescent, the yield of electronic excited states can to be measured and compared with a known standard. In addition to the above-described method of determining fluorescence yield, various methods of measuring excited state yield are known (including, for example, transient absorbance, phosphorescence yield, photoproduct formation or disappearance of photosensitizer (from photoreaction), and the like).

Preferably, the two-photon absorption cross-section of the photosensitizer is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble and/or compatible with the reactive species and binders, if present, in the imageable composition. Most preferably, the photosensitizer is also capable of sensitizing 2-methyl-4,6-bis (trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (such as the compounds available under the trade designation BUTVAR B76 from Monsanto); 0.3 parts trimethylolpropane trimethacrylate; and 0.03 parts 2-methyl-4,6-bis (trichloromethyl)-s-triazine (see Bull. Chem. Soc. Japan, 42, 2924–2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (such as, for example, those available under the trade designation FCH 650 watt quartz-iodine lamp from General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a photosensitizer can also be selected based in part upon shelf stability considerations. Accordingly, selection of a particular photosensitizer can depend to some extent upon the particular reactive species utilized (as well as upon the choices of electron donor compound and/or electron acceptor).

Particularly preferred multiphoton photosensitizers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride and the hexafluoroantimonate salt of Rhodamine B) and the four classes of photosensitizers described, for example, in WO 98/21521 and WO 99/53242. The four classes can be described as follows: (a) molecules in which two donors are connected to a conjugated π-electron bridge; (b) molecules in which two donors are connected to a conjugated π-electron bridge which is substituted with one or more electron accepting groups; (c) molecules in which two acceptors are connected to a conjugated π-electron bridge; and (d) molecules in which two acceptors are connected to a conjugated π-electron bridge which is substituted with one or more electron donating groups (where "bridge" means a molecular fragment that connects two or more chemical groups, "donor" means an atom or group of atoms with a low ionization potential that can be bonded to a conjugated π-electron bridge, and "acceptor" means an atom or group of atoms with a high electron affinity that can be bonded to a conjugated π-electron bridge).

Representative examples of such photosensitizers include the following:

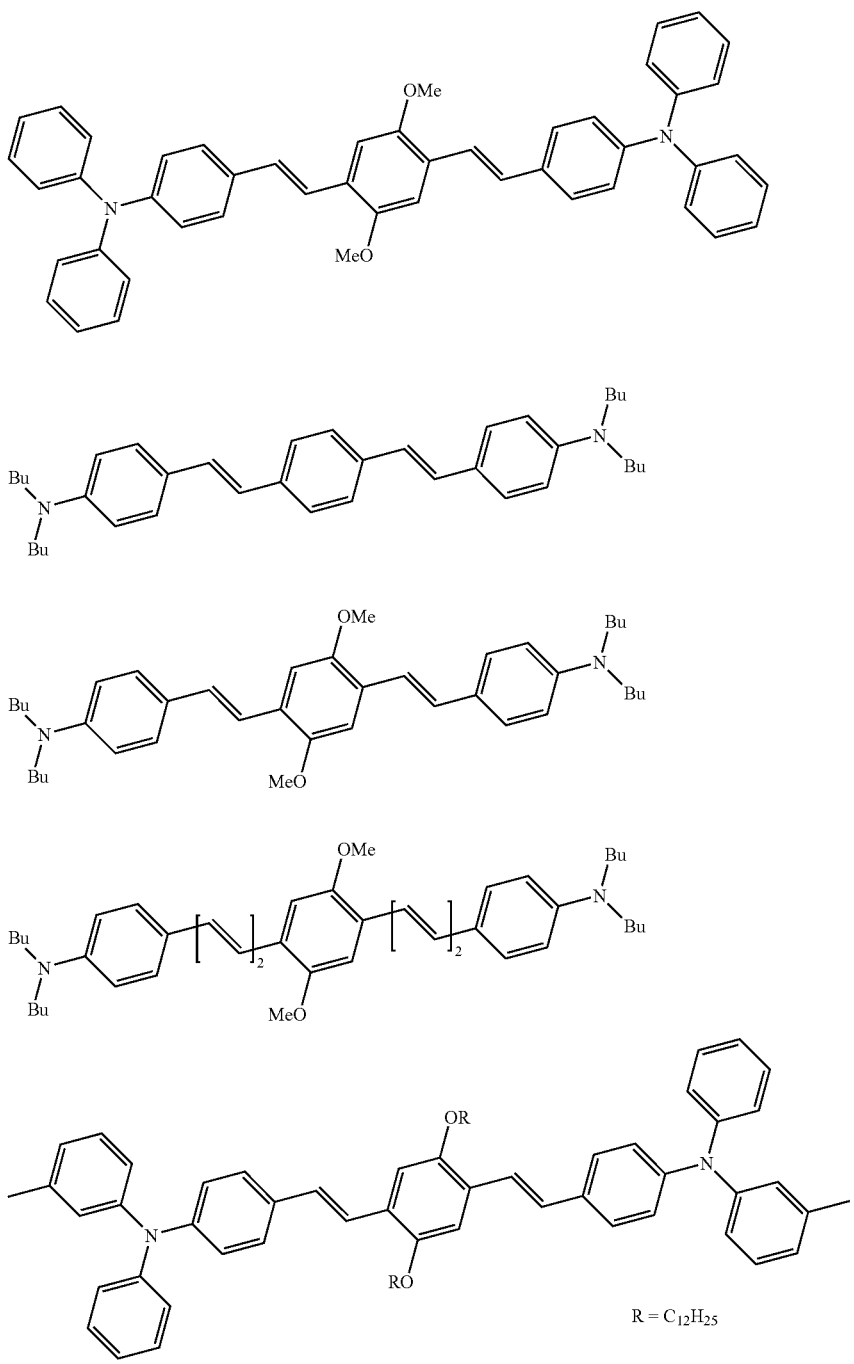

-continued
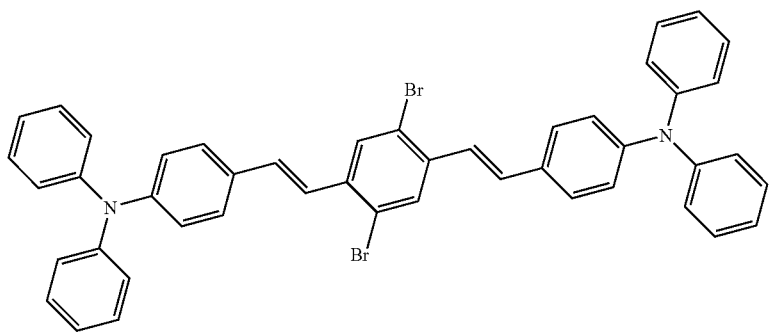
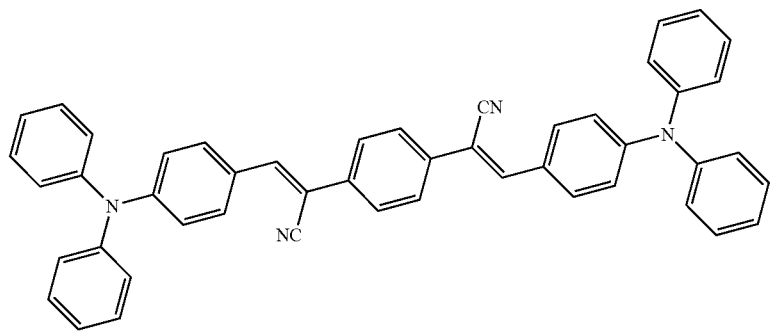
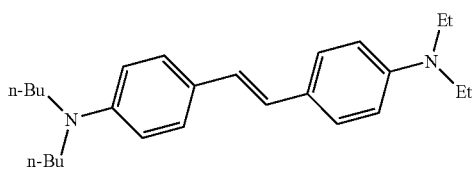
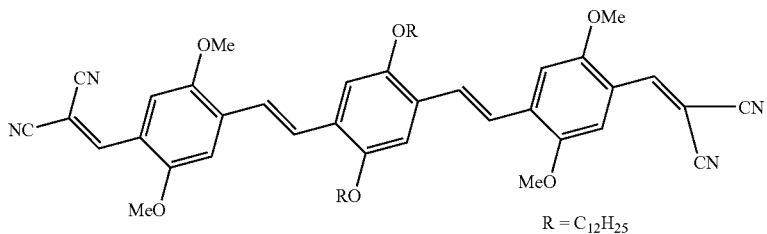
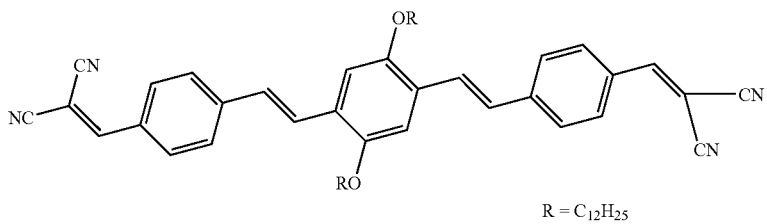
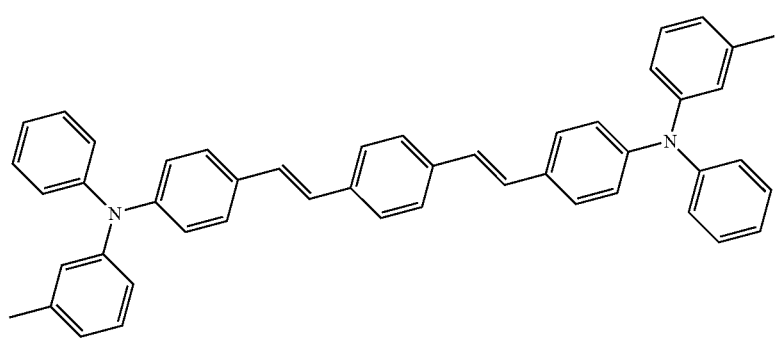

-continued
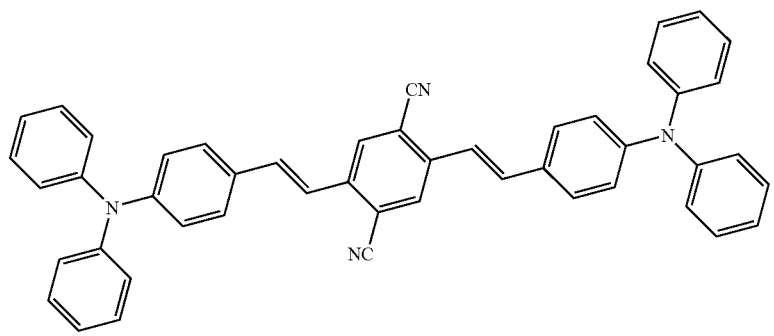
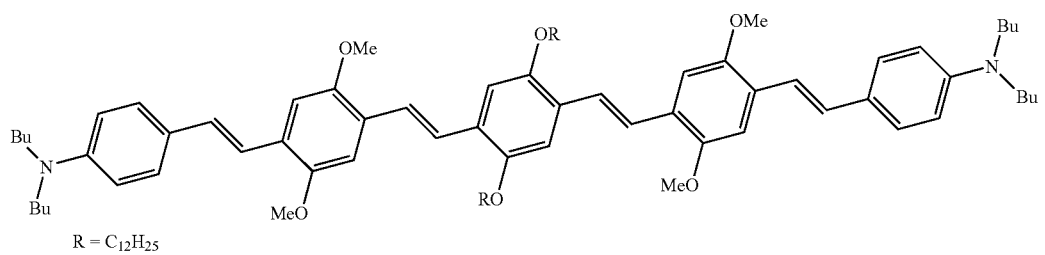
R = C₁₂H₂₅
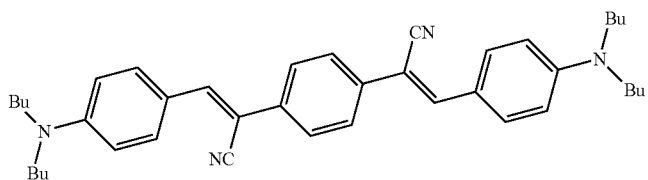
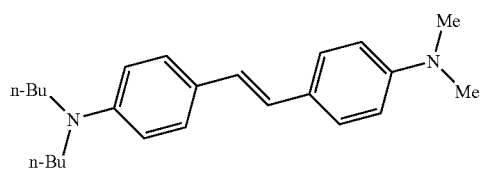
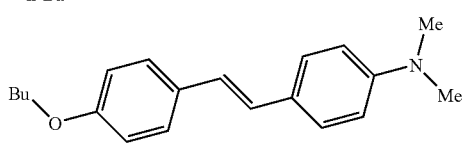
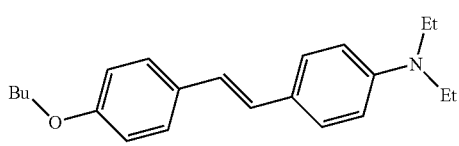
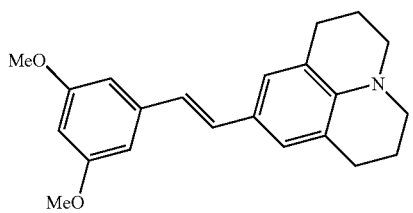
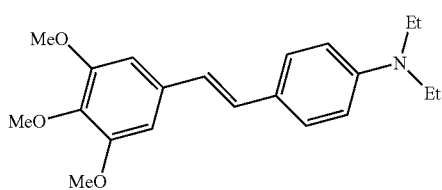
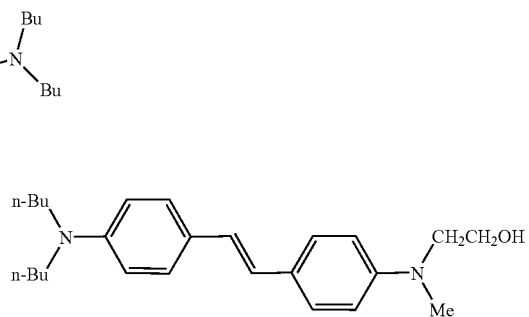
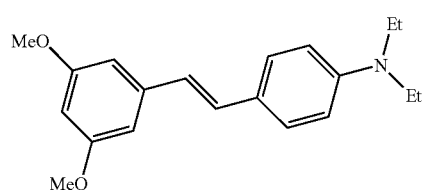
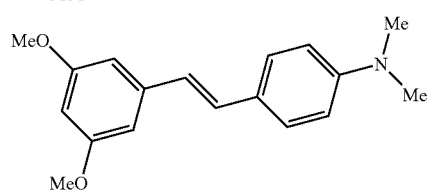
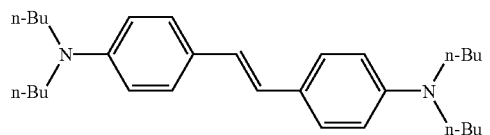
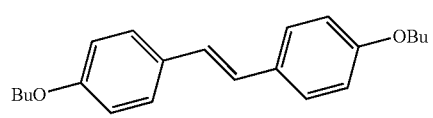

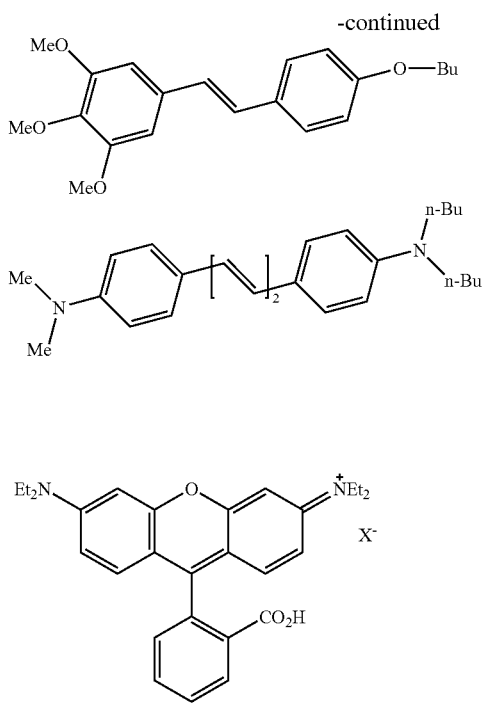
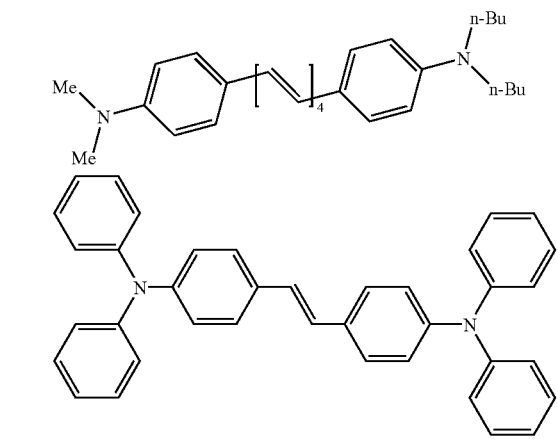

where X⁻ = Cl⁻, PF₆⁻, SbF₆⁻, AsF₆⁻, BF₄⁻, CF₃SO₃⁻

The four above-described classes of photosensitizers can be prepared by reacting aldehydes with ylides under standard Wittig conditions or by using the McMurray reaction, as detailed in WO 98/21521.

Particularly preferred multiphoton photosensitizers include those exhibiting large multiphoton absorption cross-sections and having one-photon absorption maxima at short wavelengths to prevent discoloration of the final image. Preferably, multiphoton photosensitizers have one-photon absorption maxima less than 500 nm; preferably less than 475 nm; and most preferably less than 450 nm. Representative examples of such photosensitizers include stilbene type multiphoton photosensitizers having the following structural formulas:

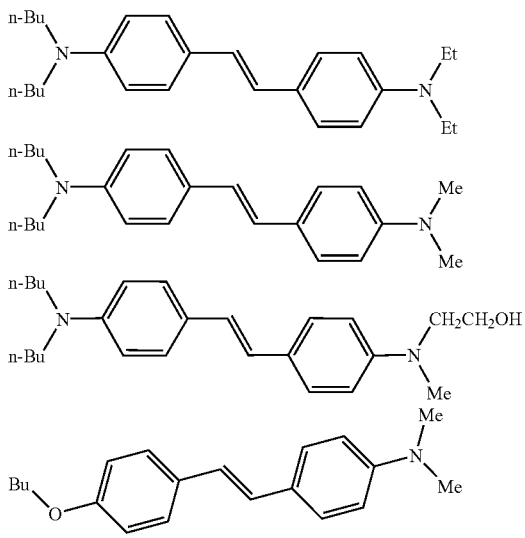
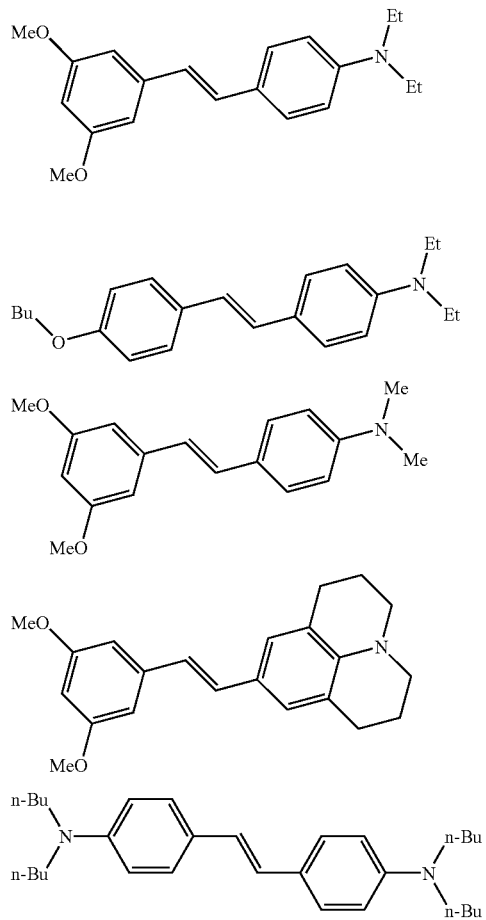

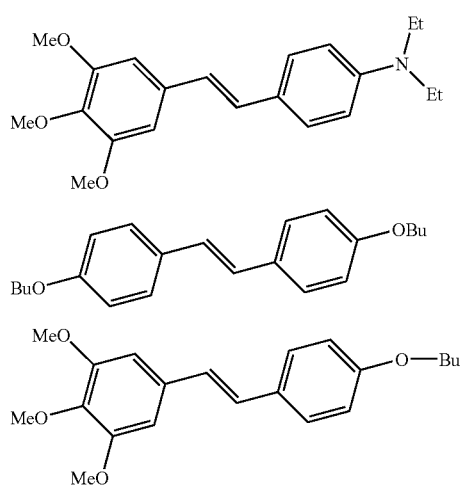
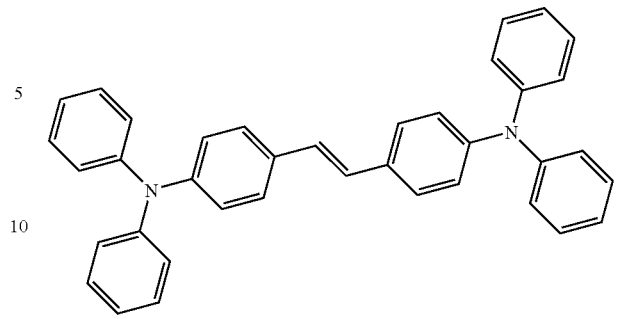
Other compounds are described in U.S. Pat. Nos. 6,100,405, 5,859,251, and 5,770,737 as having large multiphoton absorption cross-sections, although these cross-sections were determined by a method other than that described above. Representative examples of such compounds include the following:
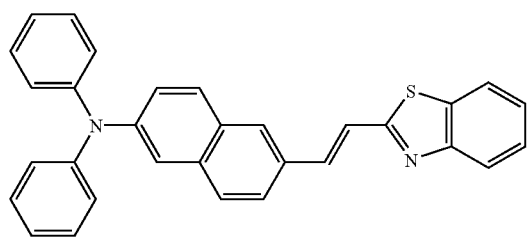
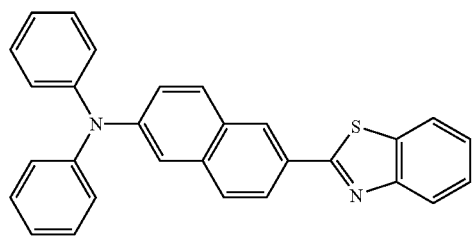
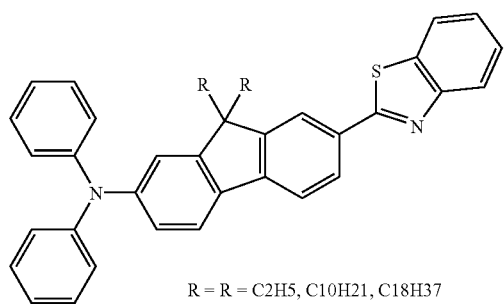
R = R = C2H5, C10H21, C18H37
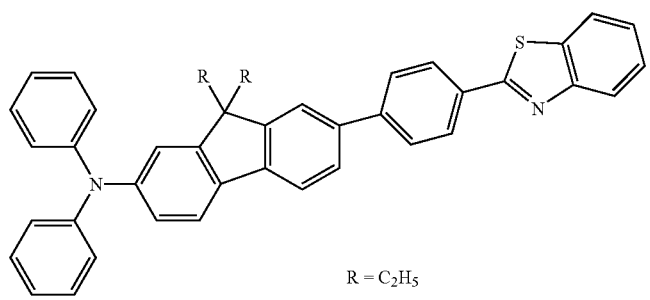
R = C$_2$H$_5$
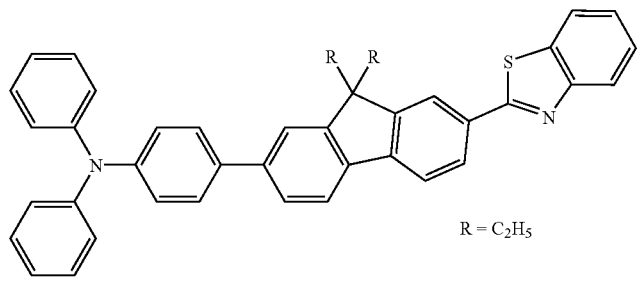
R = C$_2$H$_5$

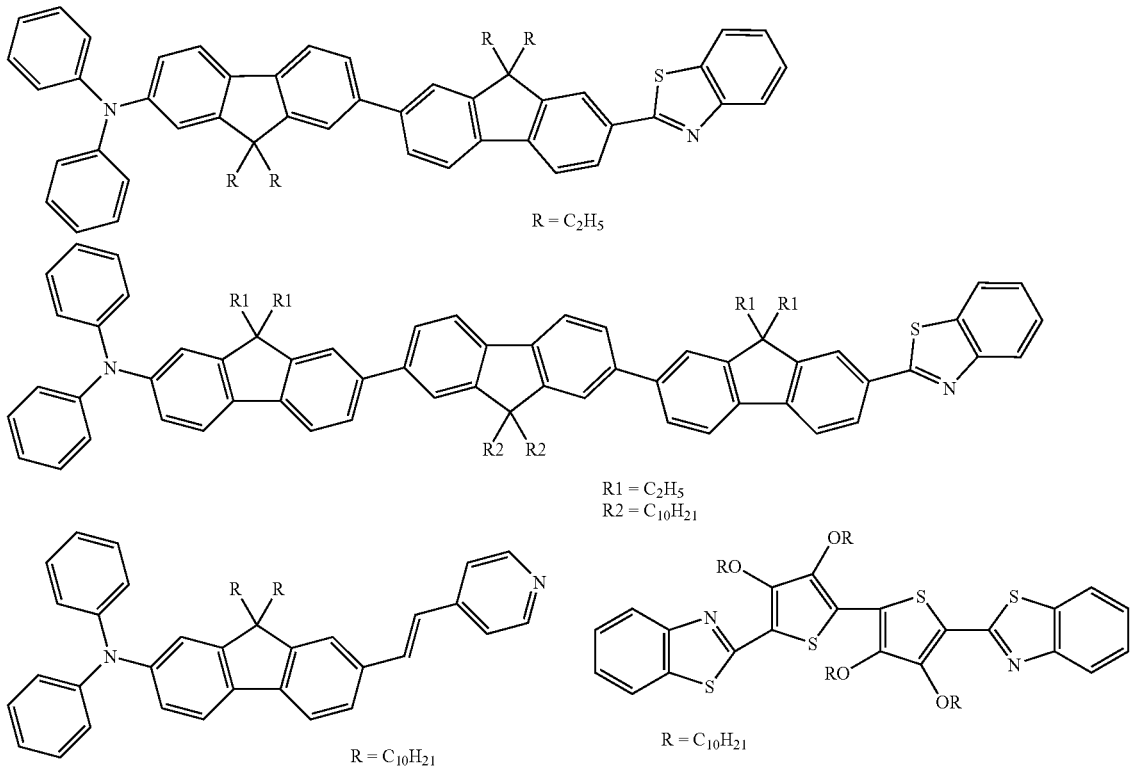

Suitable electron acceptors for the reactive species of the photoactive system are those that are capable of being photosensitized by accepting an electron from an electronic excited state of the multiphoton photosensitizer, resulting in the formation of at least one free radical and/or acid. Such electron acceptors include iodonium salts (for example, diaryliodonium salts), chloromethylated triazines (for example, 2-methyl-4,6-bis(trichloromethyl)-s-triazine, 2,4,6-tris(trichloromethyl)-s-triazine, and 2-aryl-4,6-bis (trichloromethyl)-s-triazine), diazonium salts (for example, phenyldiazonium salts optionally substituted with groups such as allyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The electron acceptor is preferably soluble in the reactive species and is preferably shelf-stable (that is, does not spontaneously promote reaction of the reactive species when dissolved therein in the presence of the photosensitizer and the electron donor compound). Accordingly, selection of a particular electron acceptor can depend to some extent upon the particular reactive species, photosensitizer, and electron donor compound chosen, as described above.

Suitable iodonium salts include those described in U.S. Pat. Nos. 5,545,676, 3,729,313, 3,741,769, 3,808,006, 4,250,053 and 4,394,403. The iodonium salt can be a simple salt (for example, containing an anion such as Cl—, Br—, I— or C4H5 SO3—) or a metal complex salt (for example, containing $SbF_6$—, $PF_6$—, $BF_4$—, tetrakis(perfluorophenyl) borate, $SbF_5$ OH— or $AsF_6$—). Mixtures of iodonium salts can be used if desired.

Examples of useful aromatic iodonium complex salt electron acceptors include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl) iodonium hexafluorophosphate; di(4-chlorophenyl) iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl) iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, those available under the trade designation SARCAT SR 1012 from Sartomer Company), and mixtures thereof.

Useful chloromethylated triazines include those described in U.S. Pat. No. 3,779,778, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954,475.

Useful diazonium salts include those described in U.S. Pat. No. 4,394,433, which comprise a light sensitive aromatic moiety (for example, pyrrolidine, morpholine, aniline, and diphenyl amine) with an external diazonium group (—N+=N) and an anion (for example, chloride, tri-isopropyl naphthalene sulfonate, tetrafluoroborate, and the bis(perfluoroalkylsulfonyl)-methides) associated therewith. Examples of useful diazonium cations include 1-diazo-4-anilinobenzene, N-(4-diazo-2,4-dimethoxy phenyl) pyrrolidine, 1-diazo-2,4-diethoxy-4-morpholino benzene, 1-diazo-4-benzoyl amino-2,5-diethoxy benzene, 4-diazo-2,5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053, which can be represented by the formulas:

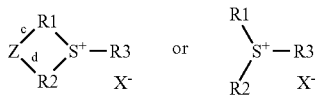

wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, —S(=O)—, —C(=O)—, —(O=)S(=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —(R$_4$)C(—R$_5$)—, where $R_4$ and $R_5$ are independently selected from the group consisting of hydrogen, alkyl groups having from 1 to about 4 carbon atoms, and alkenyl groups having from about 2 to about 4 carbon atoms. X— is an anion, as described below.

Suitable anions, X—, for the sulfonium salts (and for any of the other types of electron acceptors) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3 C^-$, $(CF_3SO_2)_3C^{31}$, $(CF_3SO_2)_2N^-$, $(C_4F_9SO_2)_3 C^-$, $(CF_3SO_2)_2(C_4F_9SO_2)C^-$, $(CF_3SO_2)(C_4F_9SO_2)N^{31}$, $((CF_3)_2NC_2F_4SO_2)_2N^-$, $(CF_3)_2NC_2F_4SO_2C^-(SO_2CF_3)_2$, $(3,5-bis(CF_3)C_6H_3)SO_2N^-SO_2CF_3$, $C_6H_5SO_2C^-(SO_2CF_3)_2$, $C_6H_5SO_2N^{31} SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5-bis(CF_3)C_6H_3)_4B^-$, $(C_6F_5)_4B^-$, $(p-CF_3C_6H_4)_4B^{31}$, $(m-CF_3C_6H_4)_4B^-$, $(p-FC_6H_4)_4B^-$, $(C_6F_5)_3(CH_3)B^-$, $(C_6F_5)_3(n-C_4H_9)B^-$, $(p-CH_3C_6H_4)_3(C_6F_5)B^-$, $(C_6F_5)_3FB^-$, $(C_6H_5)_3(C_6F_5)B^{31}$, $(CH_3)_2(p-CF_3C_6H_4)_2B^-$, $(C_6F_5)_3(n-C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5-bis(CF_3)C_6H_3)_4B^-$, $(C_6F_5)_4B^-$, $(C_6F_5)_3(n-C_4H_9)B^-$, $(C_6F_5)_3FB^-$, and $(C_6F_5)_3(CH_3)B^-$.

Suitable anions containing other metal or metalloid centers include, for example, $(3,5-bis(CF_3)C_6H_3)_4Al^-$, $(C_6F_5)_4 Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. Preferably, the anion, X—, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt electron acceptors include:

triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, SARCAT SR1010 available from Sartomer Company), triarylsulfonium hexafluorophosphate (for example, SARCAT SR 1011 available from Sartomer Company), and triarylsulfonium hexafluorophosphate (for example, SARCAT K185 available from Sartomer Company).

Useful azinium salts include those described in U.S. Pat. No. 4,859,572, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the photosensitizer to the azinium electron acceptor. In one preferred form, the quaternizing substituent is an oxy substituent. The oxy substituent, —O-T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)-$T^1$ radical, where $T^1$ can be any of the various alkyl and aralkyl radicals described above. In addition, $T^1$ can be an aryl radical, such as phenyl or naphthyl. The aryl radical can in turn be substituted. For example, $T^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O—T, contains 1 or 2 carbon atoms. The azinium nuclei need include no substituent other than the quaternizing substituent. However, the presence of other substituents is not detrimental to the activity of these electron acceptors.

Useful triarylimidazolyl dimers include those described in U.S. Pat. No. 4,963,471. These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred electron acceptors include photoacid generators, such as iodonium salts (more preferably, aryliodonium salts), chloromethylated triazines, sulfonium salts, and diazonium salts. More preferred are aryliodonium salts and chloromethylated triazines.

The photoacid generators described above can be used to liberate oxidizing ions from a variety of salts, such as nitrate salts, under the conditions of the method. Nitrate salts may be supplied as various chemical compounds, but are desirably provided as a metal salt, and most preferably provided as a hydrated metal salt. Other ions, which are ordinarily good oxidizing ions, such as nitrite, chlorate, iodate, perchlorate, periodate, and persulfate do not provide comparable results. Extremely active oxidizing agents, such as iodate, even used in relatively smaller proportions to prevent complete and immediate oxidation or colorization of dyes do not perform nearly as well as nitrate ion compositions. The performance of nitrate is so far superior to any other ion that it is apparently unique in the practice of the present invention.

Most means of supplying the nitrate salt into the composition are satisfactory, for example, organic salts, metal salts, acid salts, mixtures of acids and salts, and other means of supplying the ion are useful. For example, nitrates of zinc, cadmium, potassium, calcium, zirconyl ($ZrO_2$), nickel, aluminum, chromium, iron, copper, magnesium, lead and cobalt, ammonium nitrate, and cerous ammonium nitrate have been used.

The nitrate salt component of the present invention is desirably present in a form within the imaging layer so that oxidizing quantities of $HNO_3$, NO, $NO_2$, or $N_2O_4$ will be provided within the layer when it is heated to a temperature no greater than about 200° C. for about 60 seconds and preferably no greater than about 160° C. for about 60 or most preferably about 30 seconds. This may be accomplished with many different types of salts, both organic and inorganic, and in variously different types of constructions.

The most convenient way of providing such thermal oxidant providing nitrate salts is to provide a hydrated nitrate salt such as aluminum nitrate nonahydrate (Al$(NO_3)_2$.9$H_2O$).

In addition to hydrated nitrate salts, non-hydrated salts, such as, for example, ammonium nitrate, pyridinium nitrate, and quanidinium nitrate in an acidic environment are also capable of providing the oxidizing capability necessary for practice of the present invention.

Beside the inorganic types of salts generally described above, organic salts in non-alkaline environments are also quite useful in the practice of the present invention. In particular, nitrated quaternary ammonium salts such as guanadinium nitrate work quite well in acid environments, but will not provide any useful image in a basic environment.

It is believed that the alkaline environment causes any oxidizing agent (e.g., $HNO_3$, NO, $NO_2$ and/or $N_2O_4$), which is liberated from the nitrate salt, to be neutralized so as to prevent oxidation of the leuco dyes. For this reason it is preferred to have an acid environment for the nitrate salt.

One other consideration should be given in the selection of the nitrate salt and that is the choice of a salt in which the cation is non-reactive with the dye. Non-reactive salts are defined in the practice of the present invention as those salts the cations of which do not spontaneously oxidize the dyes that they are associated with at room temperature. This may be readily determined in a number of fashions. For example, the dye and a non-nitrate (preferably halide) salt of the cation may be codissolved in a solution. If the salt oxidizes the dye spontaneously (within two minutes) at room temperature, it is a reactive salt. Such salts as silver nitrate, in which the cation is itself a strong oxidizing agent, is a reactive salt. Ceric nitrate is also reactive, while hydrated cerous nitrate is not. Preferred salts are the hydrated metal salts such as nickel nitrate hexahydrate, magnesium nitrate hexahydrate, aluminum nitrate nonahydrate, ferric nitrate nonahydrate, cupric nitrate trihydrate, zinc nitrate hexahydrate, cadmium nitrate tetrahydrate, bismuth nitrate pentahydrate, thorium nitrate tetrahydrate, cobalt nitrate hexahydrate, gadolinium or lanthanum nitrate nonahydrate, mixtures of these hydrated nitrates and the like. Nonhydrated or organic nitrates may be admixed therewith.

It is preferred to have at least 0.10 moles of nitrate ion per mole of leuco dye. It is more preferred to have at least 0.30 or 0.50 moles of ion per mole of dye. Even amounts of 1.0 mole of nitrate ion per mole of dye have been found useful. The nitrate ordinarily constitutes from 0.05 to 10 percent by weight of the imaging layer, preferably 0.1 to 10 and most preferably 0.5 to 8 percent by weight.

Dye precursors known as "leuco dyes" are suitable for the practice of this invention. Leuco dyes useful in the present invention are those that are reactive or oxidizable under moderate oxidizing conditions and yet that are not so reactive as to oxidize under common environmental conditions. Such leuco dyes tend to be colorless until they are oxidized and which, once oxidized, exhibit a visible color. Oxidized dyes are colored by virtue of their absorbance of light in the visible portion of the electromagnetic spectrum (approximately 400–700 nm).

There are many known chemical classes of leuco dyes. Such materials include leuco quinone dyes, leuco thiazine, oxazine and phenazine dyes and leuco triarylmethane dyes that become colored on oxidation, and phthalide type color formers that become colored on reaction with acids. Such color formers are described for example in R. Muthyala, *Chemistry and Applications of Leuco Dyes,* Plenum Press, New York, N.Y., 1997; in H. Zollinger, *Color Chemistry,* VCH, Weinheim, G E, 1991, Chapter 8; and in *Colorants and Auxiliaries,* Vol. 2, J. Shore, ed., Society of Dyers and Colourists, Bradford, England, 1990, Chapter 12.

Leuco dyes useful as reactive species in the present invention include leuco azine, phenoxazine, and phenothiazine, which can, in part, be represented by the structural formula,

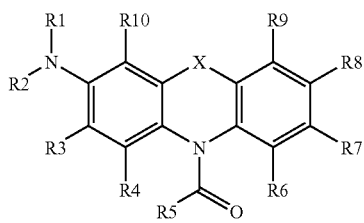

wherein X is selected from $-N-R^{11}$, O, or S; $R^1$ and $R^2$ are independently selected from H and alkyl groups of 1 to about 4 carbon atoms; $R^3$, $R^4$, $R^6$, and $R^7$ are independently selected from H and alkyl groups of 1 to about 4 carbon atoms, preferably methyl; $R^5$ is selected from alkyl groups of 1 to about 16 carbon atoms, alkoxy groups of 1 to about 16 carbon atoms, and aryl groups of up to about 16 carbon atoms; $R^8$ is selected from $-N(R^1)(R^2)$, H, alkyl groups of 1 to about 4 carbon atoms, wherein $R^1$ and $R^2$ are independently selected and defined as above; $R^9$ and $R^{10}$ are independently selected from H and alkyl groups of 1 to about 4 carbon atoms; and $R^{11}$ is selected from alkyl groups of 1 to about 4 carbon atoms and aryl groups of up to about 11 carbon atoms (preferably, phenyl groups). The following compounds are examples of this type of leuco dye:

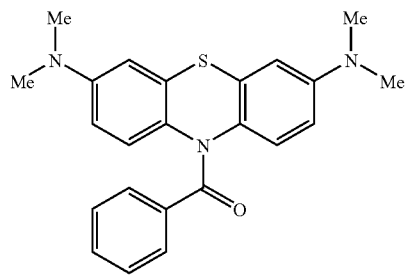

Copichem II

Other suitable leuco dyes include those with the following structural formulas, wherein both leuco and active dye structures are shown:

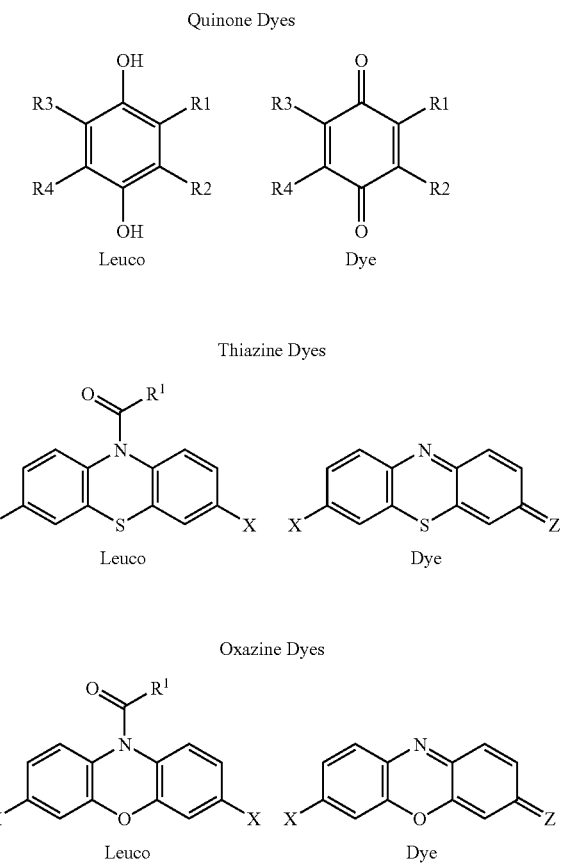

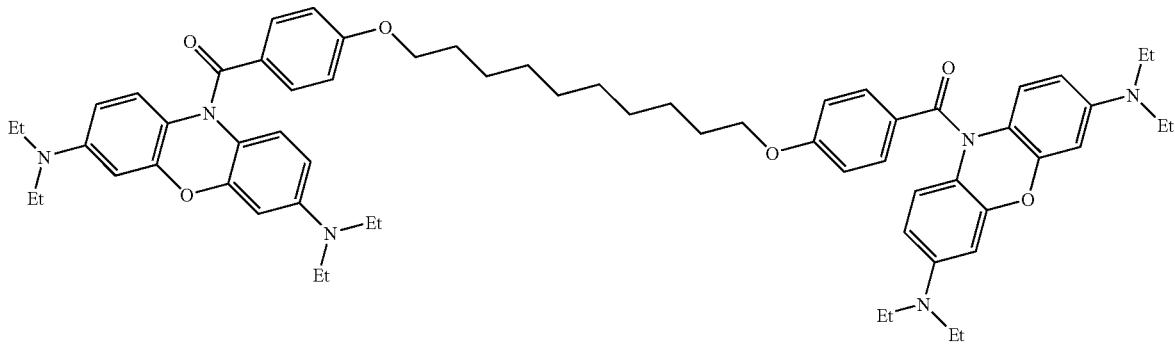

-continued
Phenazine Dyes

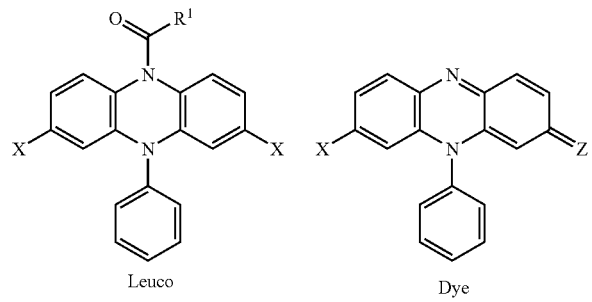

Leuco      Dye

Triarylmethane Dyes

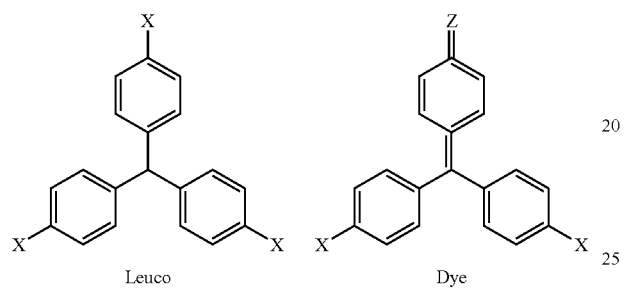

Leuco      Dye

Phenoxyimidazole Dyes

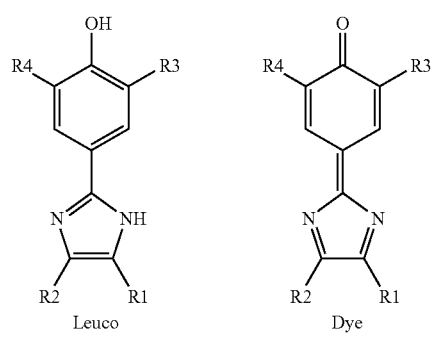

Leuco      Dye

Pyrimidinetriones Dyes

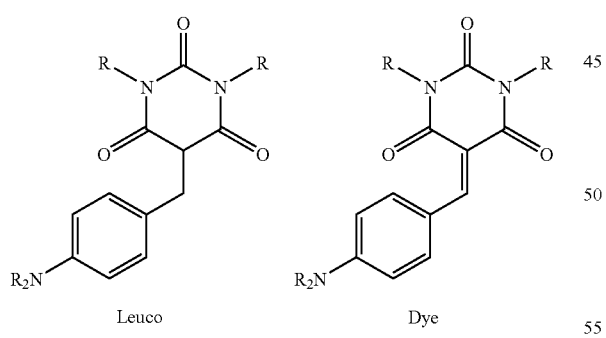

Leuco      Dye

Malobenzylidine Dyes

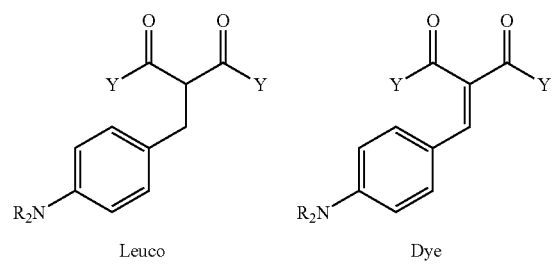

Leuco      Dye

-continued
Maloanaline Dyes

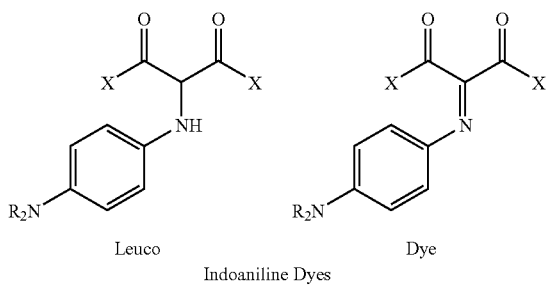

Leuco      Dye

Indoaniline Dyes

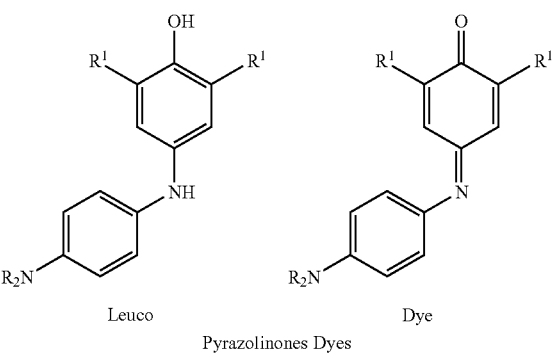

Leuco      Dye

Pyrazolinones Dyes

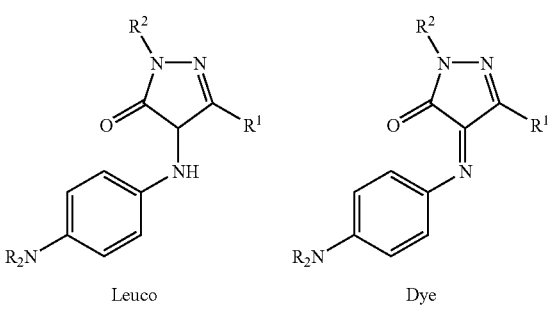

Leuco      Dye

Ketazine/Aldazine Dyes

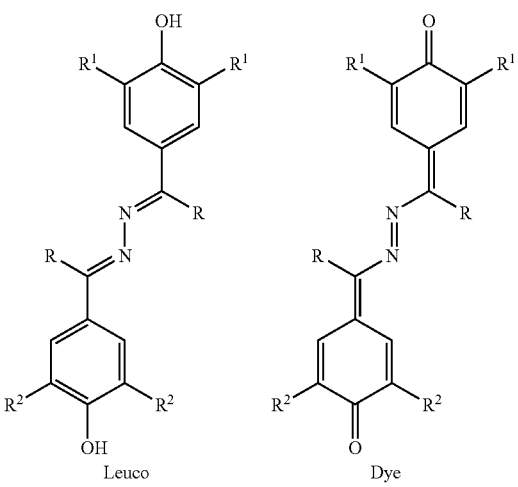

Leuco      Dye wherein, R=allyl or aryl; $R^1$–$R^4$=alkyl, alkoxy, aryl, aryloxy, amino, alkylamino, dialkylamino, or acetamido; X=hydroxyl, amino, alkylamino, arylamino, dialkylamino, or diarylamino; Y=alkyl, alkoxy, aryl, aryloxy, amino, alkylamino, or dialkylamino; Z=O or $NR_2^+$.

Examples of acid developed leuco dyes include phthalide and fluoran dyes having the following structural formulas:

Phthalide Dyes

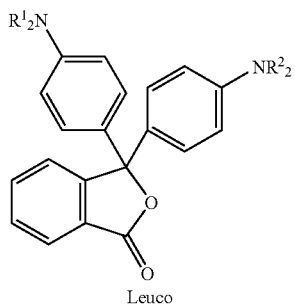
Leuco

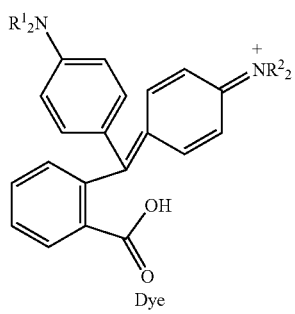
Dye

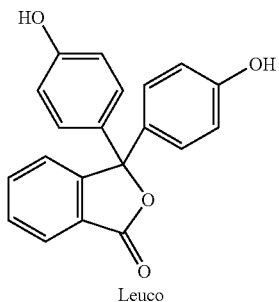
Leuco

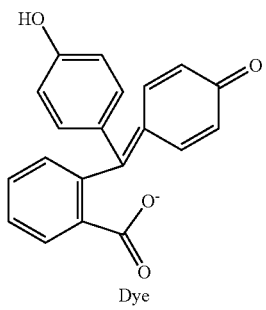
Dye

Fluoran Dyes

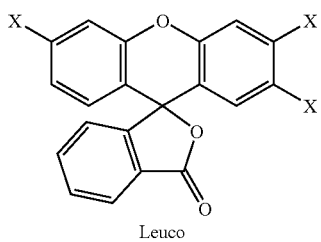
Leuco

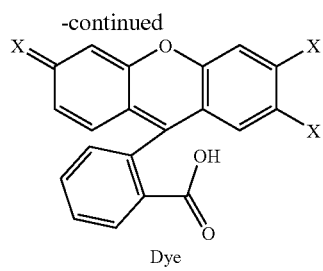
Dye wherein, R=alkyl or aryl; $R^1$–$R^2$=alkyl, alkoxy, aryl, aryloxy, amino, alkylamino, dialkylamino, or acetamido; X=hydroxyl, amino, alkylamino, arylamino, dialkylamino, or diarylamino.

The color imaging layers of the present invention may contain preformed dyes that are destroyed by the imagewise application of multiphoton photochemistry. Preferably, such dyes include those that are decolorized by the action of photochemically generated acids, free radicals, oxidants or reducing agents. These dyes are well known in the literature of non-silver halide imaging and are described, for example, in J. Kosar, *Light Sensitive Systems*, John Wiley & Sons, New York, N.Y., 1965, Chapter 8. Suitable acid bleachable dyes include those such as described by Vogel et al., in U.S. Pat. No. 5,665,552.

Acid bleachable dyes include those described in U.S. Pat. No. 5,665,522 and having the following structural formulas:

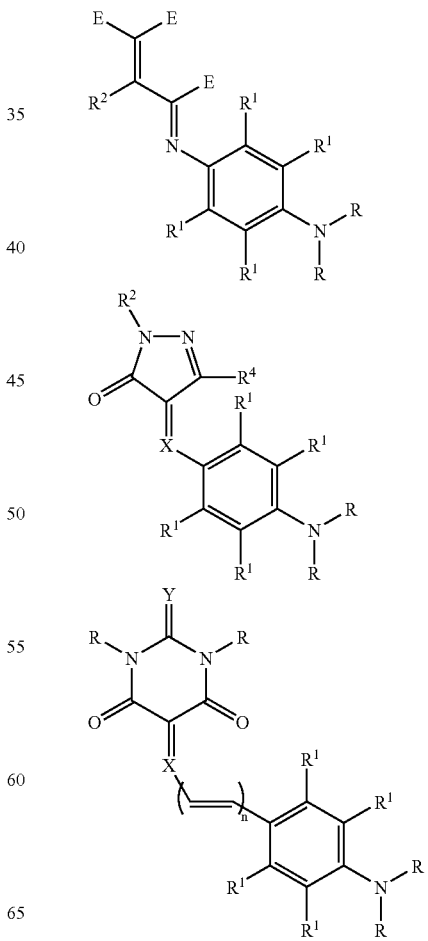

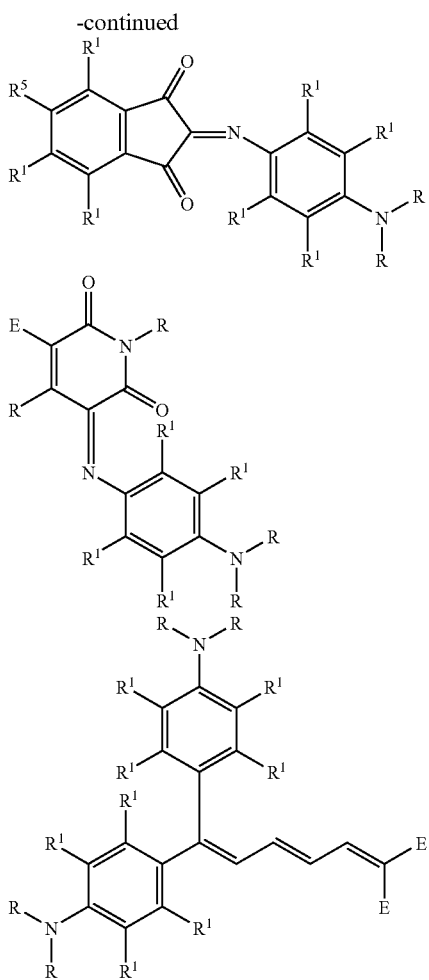

wherein R is independently an alkyl, cycloalkyl, alkaryl, or alkanoyl group having from 1 to 16 carbon atoms, or each R together with the nitrogen atom to which they are attached represents the necessary atoms to form a five- or six-membered ring; $R^1$ is independently hydrogen, halogen, cyano, or an alkyl, cycloalkyl, or alkoxy group having from 1 to 8 carbon atoms; or R and $R^1$ together with the nitrogen and two carbon atoms by which they are connected represent the necessary atoms to form a five- or six-membered ring; $R^2$ is Ar or an alkyl, cycloalkyl, or alkaryl group having from 1 to 16 carbon atoms; Ar is a substituted or unsubstituted aryl group, preferably a substituted or unsubstituted phenyl or naphthyl group; E is independently an electron withdrawing group selected from the group consisting of CN, $SO_2R^3$, $C(O)R^3$, and $NO_2$; and $R^3$ is independently an alkyl, cycloalkyl, or alkaryl group having from 1 to 16 carbon atoms, or each $R^3$ taken together with the atoms to which they are attached represent the necessary atoms to form a five- or six-membered ring; X is N or $CR^1$ $R^4$ is H, $CH_3$, $NHR^2$, $NHC(O)R^2$, or $NR_2$; Y is O or S; n is 0 or 1 (with the proviso that when Y is S, then X is N); $R^5$ is $R^1$, or $R^5$ and $R^1$ taken together with the two carbon atoms by which they are connected represent the necessary atoms to form a five- or six-membered carbocyclic or heterocyclic, non-aromatic or aromatic ring.

Other useful leuco dyes include, but are not limited to, Leuco Crystal Violet (4,4',4"-methylidynetris-(N,N-dimethylaniline)), Leuco Malachite Green (p,p'-benzylidenebis-(N,N-dimethylaniline)), Leuco Ataeryl Orange-LGM (Color Index Basic Orange 21, Comp. No. 48035 (a Fischer's base type compound)) having the structural formula:

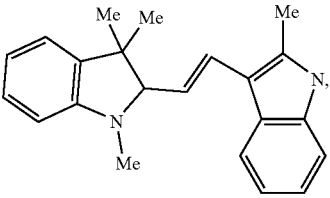

Leuco Atacryl Brilliant Red-4G (Color Index Basic Red 14) having the structural formula

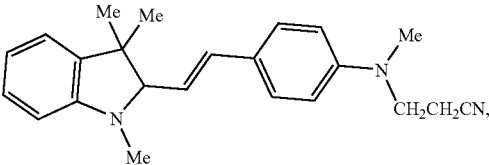

Leuco Atacryl Yellow-R (Color Index Basic Yellow 11, Comp. No. 48055) having the structural formula

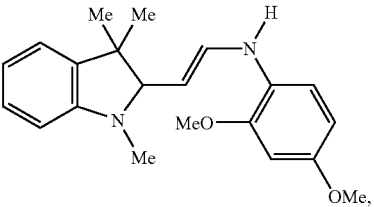

Leuco Ethyl Violet (4,4',4"-methylidynetris-(N,N-diethylaniline), Leuco Victoria Blu-BGO (Color Index Basic Blue 728a, Comp. No. 44040; 4,4'-methylidynebis-(N,N,-dinethylaniline)-4-(N-ethyl-1-napthalamine)), and LeucoAtlantic Fuchsine Crude (4,4',4"-methylidynetris-aniline).

Electron donor compounds useful in the multiphoton imageable composition are those compounds (other than the photosensitizer itself) that are capable of donating an electron to an electronic excited state of the photosensitizer. The electron donor compounds preferably have an oxidation potential that is greater than zero and less than or equal to that of p-dimethoxybenzene. Preferably, the oxidation potential is between about 0.3 and 1 V vs. a standard saturated calomel electrode ("S.C.E.").

The electron donor compound is also preferably soluble in the reactive species and is selected based in part upon shelf stability considerations (as described above). Suitable donors are generally capable of increasing the speed of reaction or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406.)

In general, electron donor compounds suitable for use with particular photosensitizers and electron acceptors can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970). The potentials reflect relative energy relationships and can be used in the following manner to guide electron donor compound selection.

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The electron acceptor can accept the electron from the higher energy orbital, and the electron donor compound can donate an electron to fill the vacancy in the originally occupied orbital, provided that certain relative energy relationships are satisfied.

If the reduction potential of the electron acceptor is less negative (or more positive) than that of the photosensitizer, an electron in the higher energy orbital of the photosensitizer is readily transferred from the photosensitizer to the lowest unoccupied molecular orbital (LUMO) of the electron acceptor, since this represents an exothermic process. Even if the process is instead slightly endothermic (that is, even if the reduction potential of the photosensitizer is up to 0.1 volt more negative than that of the electron acceptor) ambient thermal activation can readily overcome such a small barrier.

In an analogous manner, if the oxidation potential of the electron donor compound is less positive (or more negative) than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 volt more positive than that of the electron donor compound), ambient thermal activation can readily overcome such a small barrier.

Slightly endothermic reactions in which the reduction potential of the photosensitizer is up to 0.1 volt more negative than that of the electron acceptor, or the oxidation potential of the photosensitizer is up to 0.1 volt more positive than that of the electron donor compound, occur in every instance, regardless of whether the electron acceptor or the electron donor compound first reacts with the photosensitizer in its excited state. When the electron acceptor or the electron donor compound is reacting with the photosensitizer in its excited state, it is preferred that the reaction be exothermic or only slightly endothermic. When the electron acceptor or the electron donor compound is reacting with the photosensitizer ion radical, exothermic reactions are still preferred, but still more endothermic reactions can be expected in many instances to occur. Thus, the reduction potential of the photosensitizer can be up to 0.2 volt (or more) more negative than that of a second-to-react electron acceptor, or the oxidation potential of the photosensitizer can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427–488, John Wiley and Sons, New York (1986); U.S. Pat. No. 6,025,406, and U.S. Pat. No. 5,545,676. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$ borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, (allyl)$Sn(CH_3)_3$, and $(benzyl)Sn(n-C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino) methylsilane, N,N-diethylaminotrimethylsilane, tris(dimethylamino)phenylsilane, tris(dimethylsilyl)amine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include $Ar_3B^-(n-C_4H_9)N^+(C_2H_5)_4$
$Ar_3B^-(n-C_4H_9)N^+(CH_3)_4$
$Ar_3B^-(n-C_4H_9)N^+(n-C_4H_9)_4$
$Ar_3B^-(n-C_4H_9)Li^+$
$Ar_3B^-(n-C_4H_9)N^+(C_6H_{13})_4$
$Ar_3B^-\text{---}(C_4H_9)N^+(CH_3)_3(CH_2)_2CO_2(CH_2)_2CH_3$
$Ar_3B^-\text{---}(C_4H_9)N^+(CH_3)_3(CH_2)_2OCO(CH_2)_2CH_3$
$Ar_3B^-\text{---}(sec-C_4H_9)N^+(CH_3)_3(CH_2)_2CO_2(CH_2)_2CH_3$ Ar₃B⁻—(sec-C₄H₉)N⁺(C₆H₁₃)₄
Ar₃B⁻—(C₄H₉)N⁺(C₈H₁₇)₄
Ar₃B⁻—(C₄H₉)N⁺(CH₃)₄
(p-CH₃O—C₆H₄)₃B⁻(n-C₄H₉)N⁺(n-C₄H9)₄
Ar₃B⁻—(C₄H₉)N⁺(CH₃)₃(CH₂)₂OH
ArB⁻(n-C₄H₉)₃N⁺(CH₃)₄
ArB⁻(C₂H₅)₃N⁺(CH₃)₄
Ar₂B⁻(n-C₄H₉)₂N⁺(CH₃)₄
Ar₃B⁻(C₄H₉)N⁺(C₄H₉)₄
Ar₄B⁻N⁺(C₄H₉)₄
ArB⁻(CH₃)₃N⁺(CH₃)₄
(n-C₄H₉)₄B⁻N⁺(CH₃)₄
Ar₃B⁻(C₄H₉)P⁺(C₄H₉)₄ where Ar is phenyl, naphthyl, substituted (preferably, fluoro-substituted) phenyl, substituted naphthyl, and like groups having greater numbers of fused aromatic rings, as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimetlylaininobenzaldehyde, 4-dimethylaminobenzonitrile, 4-dimethylaminophenethyl alcohol, and 1,2,4-trimethoxybenzene.

The dye species, multiphoton photosensitizers, electron donor compounds, and electron acceptors used in the imageable composition can be prepared by the methods described above or by other methods known in the art, and many are commercially available. The components can be combined under "safe light" conditions using any order and manner of combination (optionally, with stirring or agitation), although it is sometimes preferable (from a shelf life and thermal stability standpoint) to add the electron acceptor last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The components of the multiphoton imageable composition are present in photochemically effective amounts (as defined above). Generally, the composition can contain from about 0.01% to about 10% by weight of one or more photosensitizers (preferably, from about 0.1% to about 5%; more preferably, from about 0.2% to about 2%); up to about 10% by weight of one or more electron donor compounds (preferably, from about 0.1% to about 10%; more preferably, from about 0.1% to about 5%); and from about 0.1% to about 10% by weight of one or more electron acceptors (preferably, from about 0.1% to about 5%) based upon the total weight of solids (that is, the total weight of components other than solvent). The leuco dye(s) can generally be present at levels of at least about 0.01% by weight of the total weight of a light sensitive layer (preferably, at least about 0.3% by weight; more preferably, at least about 1% by weight; most preferably, at least about 2% to 10% or more by weight).

A wide variety of adjuvants can be included in the multiphoton imageable compositions, depending upon the desired end use, so long as the adjuvants do not interfere with absorption of energy by components of the multiphoton-sensitive photoactive system. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that call adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly (methyl methacrylate), poly(styrene)-co-(acrylonitrile), cellulose acetate butyrate (CAB), and the like. Generally, polymeric binders are present at levels of at least about 50% to about 99.8% based upon total weight of the multiphoton imageable composition.

The present invention can be photosensitive coatings and overcoatings on organic and inorganic substrates, to provide films, composites, or layered structures. Preferred substrates are generally sufficiently flat to enable the preparation of a layer of photoreactive composition having a uniform. For applications where coating is less desirable, the photoreactive compositions can alternatively be exposed in bulk form.

Prior to exposure, the resulting photoactive compositions can be coated on a substrate, if desired, by any of a variety of coating methods known to those skilled in the art. Coatings and overcoatings may be applied by methods known in the art such as bar, knife, reverse roll, knurled roll, spin coating, or by dipping, spraying, brushing, curtain coating and the like. The coating thickness is preferably greater than about 1 micron and less than about 50 microns; more preferably less than 25 microns; and most preferably less than 10 microns.

The method involves preparing a multilayer light-sensitive composite structure including at least two layers coated with the multiphoton imageable composition.

Preferably, the composite structure includes three to four layers with one layer that includes at least one cyan dye or dye precursor, a second layer that includes at least one magenta dye or precursor, and a third layer that includes at least one yellow dye or dye precursor. A fourth layer may be included that contains at least one black dye or dye precursor. At least one ultraviolet light absorbing species may be included in one of the layers of the composite structure.

The composite structure may have a further inert layer between at least two of the dye or dye precursor containing layers. Suitable inert layers can serve to hinder diffusion of the dye or dye precursors between layers and include polymeric layers, such as those made of e.g., poly(vinyl alcohol). In addition, the construction may include one or more protective layers.

The present invention may be useful in graphic or visual arts, color proofing, display applications, and the like. For display applications, the invention can be used to make display components or display devices.

For example, the multiphoton technology may be useful for producing color filters or flat panel displays, including but not limited to transmissive displays (of which liquid crystal displays are an example), emissive displays (of which plasma display panels and inorganic and organic light emitting diodes are examples), or reflective displays or any combination thereof. The shapes of the color elements in the color filter may be simple geometric objects such as rectangles, squares or triangles. Alternatively, for some configurations of color filters, the color elements may be created as stripes. Another common configuration for a color filter array is when the color elements in one row are displaced by one element in the second row and by two elements in the third row such that the color elements are diagonally aligned.

The dimensions of the color elements can range from 5–1000 microns. More typically the dimensions are on the order of 50–300 microns. These dimensions are easily produced by photolithographic and laser imaging techniques. In some specialized applications, the dimensions of the elements may be less than 5 microns.

The colors used to form a color filter are generally the primary additive colors, i.e. red, green, and blue. Each of these primary colors preferably has high color purity and transmittance, and, when combined, an appropriate white balance. The color filters preferably have spectral characteristics of red, green, and blue that show chromaticity close to the National Television Standards Committee (NTSC) standard colors indicated by the Commission International de l'Eclairage (CIE) chromaticity diagram. Although red, green, and blue are the most common colors for the filters, other color combinations may be used for specialty applications. In some cases, the repeat sequence in a row is red:green:blue. For other applications the repeat sequence in a row is red:green:green:blue.

Objects and advantages of this invention are further illustrated by the following examples, but the particular materials and amounts thereof recited in these examples, as well as other conditions and details, should not be construed to unduly limit this invention.

EXAMPLES

Preparatory Example 1

Synthesis of Multiphoton Photosensitizer
Reaction of 1,4-bis(bromomethyl)-2,5-dimethoxybenzene with Triethyl Phosphite:

1,4-Bis(bromomethyl)-2,5-dimethoxybenzene was prepared according to the literature procedure (Syper et al, Tetrahedron, 39, 781–792, 1983). The 1,4-bis (bromomethyl)-2,5-dimethoxybenzene (253 g, 0.78 mol) was placed into a 1000 mL round bottom flask. Triethyl phosphite (300 g, 2.10 mol) was added, and the reaction was heated to vigorous reflux with stirring for 48 hours under nitrogen atmosphere. The reaction mixture was cooled and the excess triethyl phosphite was removed under vacuum using a Kugelrohr apparatus. Upon heating to 100 C at 0.1 mm Hg, a clear oil resulted. Upon cooling, the desired product solidified and was suitable for use directly in the next step. The $^1$H NMR spectrum of the product was consistent with the desired product. Recrystallization from toluene yielded colorless needles.

Synthesis of 1,4-bis-[4-(diphenylamino)styryl]-2,5-(dimethoxy) Benzene:

A 1000 mL round bottom flask was fitted with a calibrated dropping funnel and a magnetic stirrer. The flask was charged with the product prepared from the above reaction (19.8 g, 45.2 mmol) and N,N-diphenylamino-p-benzaldehyde (25 g, 91.5 mmol, available from Fluka Chemical Corp., Milwaukee, Wis.). The flask was flushed with nitrogen and sealed with septa. Anhydrous tetrahydrofuran (750 mL) was cannulated into the flask and all solids dissolved. The dropping funnel was charged with potassium tertiary butoxide (125 mL, 1.0 M in THF). The solution in the flask was stirred, and the potassium tertiary butoxide solution was added to the contents of the flask over the course of 30 minutes. The solution was then left to stir at ambient temperature overnight. The reaction was then quenched by the addition of water (500 mL). Stirring was continued, and after about 30 minutes a highly fluorescent yellow solid had formed in the flask. The solid was isolated by filtration, air-dried, and then recrystallized from toluene (450 mL). The desired product was obtained as fluorescent needles (24.7 g, 81% yield). The $^1$H NMR spectrum of the product was consistent with the proposed structure.

Example 2

Preparation of Multicolor Imaging Solutions and Coating Methods

Three solutions were prepared.

The first solution (A) contained 4 g tetrahydrofumn, 250 mg hydroxy cyan leuco dye, 25 mg bis-(4-[(diphenylamino) styryl)]- 1,4-(dimethoxy)benzene, 25 mg diaryliodonium hexafluoroantimonate (SR1012, Sartomer), and 75 mg magnesium nitrate hhexahydrate (Aldrich). Hydroxy cyan leuco dye (4-([3,7-bis(diethylamino)-IOH-phenoxazin-10-yl ]carbonyl]-2,6-dilert-butylphenol was prepared according to Example 1 in U.S. Pat. No. 4,775,754.

The second solution (B) contained 75 mg diaryliodonium hexafluoroantimonate (SR 1012, Sartomer), 25 mg bis-[4-(diphenylamino)styryl]-1,4-(dimethoxy)benzene, and 12.5 mg pyrazolinone dye (photobleachable magenta dye). Pyrazolinone dye ((4Z)-4-{[4-(diethylamino)phenyl]imino}-5-methyl-2-phenyl-2,4-dihydro-3H-pyrazol-3-one) was prepared according to what is described in U.S. Pat. No. 5,665,522 at Column 21, line 26, as Example 13b.

The third solution (C) contained 12 g cellulose acetate butyrate (CAB-531, Eastman Chemical, Kingsport, Tenn.) and 75 g 1,2-dichloroethane (Aldrich). To each of solutions (A) and (B) was added 4 g of solution (C). Each of solutions (AC) and (BC) were coated onto microscope slides and microscope coverslips by spin coating and drying in an oven at 60° C., yielding a dry coating thickness of approximately 5 μm.

Example 3

Dose Array Experiment

A slide with a coating of magenta dye (from solution BC) was exposed in a series of lines with a light source. The light source was a diode pumped Ti:sapphire laser (Spectra-Physics) operating at a wavelength of 800 nm, pulse width 100 fs, pulse repetition rate of 80 MHz, beam diameter of approximately 2 mm. The optical train included low dispersion turning mirrors, an optical attenuator to vary the optical power, and a 40× microscope objective (numerical aperture 0.65) to focus the light into a sample. The slide was exposed in air using an average power of 6 mW, while the slide was translated relative to the objective using a computer controlled 3-axis translation stage (New England Affiliated Technologies, Inc, Lawrence, Mass.). Each successive line was offset by 5 µm and scan speed increased by 1.4×, starting at 28 µm/s. Lines were observed for all scanning speeds up to and including 1240 µm/s.

Example 4

Imaging in One Layer of a Multilayer Construction

A microscope slide coverslip coated with magenta dye was laminated to a microscope slide coated with cyan dye with the coated sides in contact and held together with tape. The laminated structure was placed on a translation stage with a spacer of approximately 0.8 mm placed under one end of the microscope slide, with the magenta-containing layer on top. The focused beam from the microscope objective was scanned in 200 lines parallel to the plane of the translation stage (i.e., inclined to the plane of the laminated structure) such that the focal point remained in only the magenta coating, translation speed of 215 µm/s, lines 10 mm long, 2.5 µm between lines, 6 mW average light intensity. An image of the lines was observed as bleached lines in a magenta background, with no cyan image.

Example 5

Imaging in One Layer of a Multilayer Construction

Samples were prepared according to the procedures described in Example 4. A similar exposure was made, using the equipment and parameters described in Example 4, with the focal point remaining in the coating containing the hydroxy cyan leuco dye. An image of the lines was observed as cyan lines, with no bleaching of the magenta layer.

Example 6

Two-Color Imaging in a Multilayer Construction

Samples were prepared according to the procedures described in Example 4. A similar exposure was made, using the equipment and parameters described in Example 4, with the focal point at the interface between the leuco hydroxy cyan-containing coating and the magenta-containing coating at the midpoint in the 10 mm lines. An image of the lines was observed as lines that were cyan on one end, colorless in a magenta background on the other end.

A number of embodiments of the invention have been described. Nevertheless, it will be understood that various modifications may be made without departing from the spirit and scope of the invention. Accordingly, other embodiments are within the scope of the following claims.

What is claimed is:

1. A multilayer imageable article, wherein the article comprises at least two layers comprising a multiphoton imageable composition, wherein the composition comprises at least one of a dye and a dye precursor; and
   a multiphoton-sensitive photoactive system, wherein the photoactive system comprises:
   a multiphoton sensitizer capable of simultaneously absorbing at least two photons;
   an electron acceptor capable of transformation to a dye-activating species upon interaction with the multiphoton sensitizer subsequent to absorption of at least two photons; and
   optionally, an electron donor.

2. The article of claim 1, wherein the article comprises at least one layer comprising at least one of a cyan dye and a cyan dye precursor, at least one layer comprising at least one of a magenta dye and a magenta dye precursor, and at least one layer comprising at least one of a yellow dye and a yellow dye precursor.

3. The article of claim 2, further comprising at least one layer comprising at least one black dye or black dye precursor.

4. The article of claim 1, wherein at least one layer further comprises at least one ultraviolet light absorber.

5. The method of claim 1 wherein the article further comprises at least one inert layer between at least two of the layers that contain a dye or a dye precursor.

6. A article for making a multicolor image, comprising:
   (a) providing a multilayer imageable article, wherein at least two layers of the article comprise:
   at least one of a dye and a dye precursor; and
   a multiphoton sensitive photoactive system, wherein the photoactive system comprises a multiphoton sensitizer capable of simultaneously absorbing at least two photons; an electron acceptor capable of transformation to a dye-activating species upon interaction with the multiphoton sensitizer subsequent to absorption of at least two photons; and optionally, an electron donor; and
   (b) imaging at least one layer to activate the photoactive system and form a multicolor image.

7. The method of claim 6, wherein each layer is irradiated sequentially.

8. The method of claim 6, wherein the image is a positive image.

9. A multiphoton imageable composition, wherein the composition comprises at least one multiphoton sensitizer capable of simultaneously absorbing at least two photons; an electron acceptor capable of transformation to a dye-activating species upon interaction with the multiphoton sensitizer subsequent to absorption of at least two photons; at least one of a dye and a dye-precursor; and, optionally, an electron donor.

10. The multiphoton imageable composition according to claim 9, wherein said composition further comprises a polymeric binder.

11. The multiphoton imageable composition according to claim 10, wherein said polymeric binder is selected from the group consisting of polystyrene, poly(methyl methacrylate), poly(styrene)-co-(acrylonitrile), cellulose acetate butyrate, and combinations thereof.

12. The multiphoton imageable composition according to claim 9, wherein said polymeric binder comprises between 50% and 99% by weight of said composition.

13. The multiphoton imageable composition according to claim 9, wherein said composition further comprises at least one electron donor compound.

14. The multiphoton imageable composition according to claim 13, wherein said electron donor compound is selected from the group consisting amines that contain one or more julolidinyl moieties, alkylarylborate salts, and salts of aromatic sulfinic acids, 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene, and combinations thereof.

15. The multiphoton imageable composition according to claim 9, wherein said at least one electron acceptor compound generates an acid upon interaction with the multiphoton sensitizer subsequent to absorption of at least two photons.

16. The multiphoton imageable composition according to claim 14, wherein said electron acceptor compound generates a free radical upon interaction with the multiphoton sensitizer subsequent to absorption of at least two photons.

17. The multiphoton imageable composition according to claim 14, wherein said electron acceptor compound is selected from the group consisting of aryliodonium salts, chloromethylated triazines, sulfonium salts, and diazonium salts.

18. The multiphoton imageable composition according to claim 13, wherein said dye-precursor comprises a leuco dye.

19. The multiphoton imageable composition according to claim 18, wherein said leuco dye is selected from the group consisting of quinone dyes, thiazine dyes, oxazine dyes, phenazine dyes, triarylmethane dyes, phenoxyimidazole dyes, pyrimidinetrione dyes, malonbenzylidine dyes, malonanaline dyes, indoaniline dyes, pyrazolinone dyes, ketazine dyes, aldazine dyes, phthalide dyes, and fluoran dyes.

20. The multiphoton imageable composition according to claim 13, wherein the composition further comprises at least one ultraviolet light absorber.

21. A multiphoton imaging system, comprising:
  (a) an exposure system comprising at least one light source and at least one optical element,
  (b) a multilayer imageable article with at least two layers comprising a multiphoton imageable composition, wherein the imageable composition comprises at least one of a dye and a dye precursor; and a multiphoton-sensitive photoactive system, the photoactive system comprising
    a multiphoton sensitizer capable of simultaneously absorbing at least two photons;
    an electron acceptor capable of transformation to a dye-activating species upon interaction with the multiphoton sensitizer subsequent to absorption of at least two photons; and
    optionally, an electron donor.

22. The system of claim 21, wherein the article comprises at least one layer comprising at least one of a cyan dye and a cyan dye precursor, at least one layer comprising at least one of a magenta dye and a magenta dye precursor, and at least one layer comprising at least one of a yellow dye and a yellow dye precursor.

23. The system of claim 21, wherein at least one layer comprises at least one black dye or black dye precursor.

24. The system of claim 21, wherein at least one layer further comprises at least one ultraviolet light absorber.

25. A method for making a multicolor proof, comprising:
  (a) providing a multilayer imageable article, wherein the article comprises at least two layers comprising a multiphoton imageable composition, wherein the imageable composition comprises at least one of a dye and a dye precursor and a multiphoton-sensitive photoactive system, the photoactive system comprising
    a multiphoton sensitizer capable of simultaneously absorbing at least two photons;
    an electron acceptor capable of transformation to a dye-activating species upon interaction with the multiphoton sensitizer subsequent to absorption of at least two photons; and
    optionally, an electron donor, and
  (b) radiation imaging, with a multiphoton process, at least one layer to activate the photoactive system and form a bleached or dye image.

26. The article of claim 1 wherein the article is at least one of a display component and a display device.

27. The method of claim 25, wherein a layer is imaged using a single wavelength of monochromatic radiation.

28. The method of claim 27, wherein multiple layers are imaged using a single wavelength of monochromatic radiation.

29. The method of claim 25, wherein a multicolor proof image is formed without lamination of imaged layers.

* * * * *

UNITED STATES PATENT AND TRADEMARK OFFICE
CERTIFICATE OF CORRECTION

PATENT NO.        : 7,026,103 B2
APPLICATION NO.   : 10/297972
DATED             : April 11, 2006
INVENTOR(S)       : Devoe, Robert J.

It is certified that error appears in the above-identified patent and that said Letters Patent is hereby corrected as shown below:

On the title page, item [56]:
Page 3 Col. 2 (Other Publications) Line 47-48 - Delete "Photopolynerization" and insert - - Photopolymerization - -, therefor.

Column 1 – Line 11 - Delete "Invention" and insert - - invention - -, therefor.

Column 2 – Line 41 (Approx.) - Delete "malting" and insert - - making - -, therefor.

Column 4 – Line 66 - Delete "lighf" and insert - - light - -, therefor.

Column 5 – Line 2 - After "thereof" delete "," and insert - - ; - -, therefor.

Column 7 – Line 44 - Delete "slate" and insert - - state - -, therefor.

Column 7 – Line 46 - Delete "photosensizizer" and insert - - photosensitizer - -, therefor.

Column 19 – Line 44 - Delete "allyl" and insert - - alkyl - -, therefor.

Column 21 – Line 57 - Delete "$C^{31}$" and insert - - $C^-$ - -, therefor.

Column 21 – Line 58 - Delete "$N^{31}$" and insert - - $N^-$ - -, therefor.

Column 21 – Line 61 - Delete "$N^{31}$" and insert - - $N^-$ - -, therefor.

Column 21 – Line 67 - Delete "$\mathbf{B^{31}}$" and insert - - $\mathbf{B^-}$ - - , therefor.

Column 22 – Line 2 - Delete "$\mathbf{B^{31}}$" and insert - - $\mathbf{B^-}$ - - , therefor.

Column 24 – Line 10-11, - Delete "$(Al(NO_3)_2 \cdot 9H_2O)$" and insert - - $(Al(NO_3)_2 \cdot 9H_2O)$ - -, therefor.

Column 27 – Line 56 (Approx.) - Delete "Malobenzylidine" and insert - - Malonbenzylidine - -, therefor.

Column 28 – Line 2 - Delete "Maloanaline" and insert - - Malonanaline - -, therefor.

Column 28 – Line 27 (Approx.) - Delete "Pyrazolinones" and insert - - Pyrazolinone - -, therefor.

UNITED STATES PATENT AND TRADEMARK OFFICE
CERTIFICATE OF CORRECTION

PATENT NO. : 7,026,103 B2
APPLICATION NO. : 10/297972
DATED : April 11, 2006
INVENTOR(S) : Robert J. Devoe It is certified that error appears in the above-identified patent and that said Letters Patent is hereby corrected as shown below:

Column 28 – Line 61 - Delete "allyl" and insert - - alkyl - -, therefor.

Column 31 – Line 57 - Delete "$CR^1 R^4$" and insert - - $CR^1;R^4$ - -, therefor.

Column 31 – Line 67 - Delete "Ataeryl" and insert - - Atacryl - -, therefor.

Column 32 – Line 40 - Delete "dinethylaniline" and insert - - dimethylaniline - -, therefor.

Column 34 – Line 41 - Delete "tris(dimethylsilyl)amine" and insert - - tris(methylsilyl)amine - -, therefor.

Column 35 – Line 4 - Delete "$(n-C_4H9)_4$" and insert - - $(n-C_4H_9)_4$ - -, therefor.

Column 35 – Line 42 - Delete "dimetlylaininobenzaldehyde" and insert - - dimethylaminobenzaldehyde - -, therefor.

Column 36 – Line 35 - Delete "call" and insert - - can - -, therefor.

Column 37 – Line 65 - Delete "Triethyl Phosphite" and insert - - triethyl phosphite - -, therefor.

Column 38 – Line 15 - Delete "Benzene" and insert - - benzene - -, therefor.

Column 38 – Line 44 (Approx.) - Delete "tetrahydrofumn" and insert - - tetrahydrofuran - -, therefor.

Column 38 – Line 45-46 (Approx.) - Delete "bis-(4-[(diphenylamino)styryl)]-1" and insert - - bis-[4-(diphenylamino)styryl]-1 - -, therefor.

Column 38 – Line 48 (Approx.) - Delete "hhexahydrate" and insert - - hexahydrate - -, therefor.

Column 38 – Line 49 (Approx.) - Delete "(4-([3," and insert - - (4-{[3, - -, therefor.

Column 38 – Line 50 - (Approx.) - Delete "]-2," and insert - - }-2 - -, therefor.

UNITED STATES PATENT AND TRADEMARK OFFICE
CERTIFICATE OF CORRECTION

PATENT NO. : 7,026,103 B2
APPLICATION NO. : 10/297972
DATED : April 11, 2006
INVENTOR(S) : Robert J. Devoe It is certified that error appears in the above-identified patent and that said Letters Patent is hereby corrected as shown below:

Column 38 – Line 50 - Delete "dilert" and insert - - ditert - -, therefor.

Column 40 – Line 24 - In Claim 5, delete "method" and insert - - article - -, therefor.

Column 40 – Line 27 - In Claim 6, delete "article" and insert - - method - -, therefor.

Column 42 – Line 42 - In Claim 29, after "without" insert - - requiring - -.

Signed and Sealed this

Eighth Day of August, 2006

JON W. DUDAS
*Director of the United States Patent and Trademark Office*